(12) United States Patent
Starikov et al.

(10) Patent No.: US 6,309,809 B1
(45) Date of Patent: *Oct. 30, 2001

(54) MULTI-LAYER INTEGRATED IMAGING/ IMAGE RECORDING PROCESS WITH IMPROVED IMAGE TOLERANCES

(75) Inventors: Alexander Starikov, Fishkill, NY (US); Douglas Seymore Goodman, Sudbury, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/183,979

(22) Filed: Oct. 31, 1998

Related U.S. Application Data

(62) Division of application No. 08/873,263, filed on Jun. 11, 1997, now Pat. No. 5,879,866, which is a continuation of application No. 08/359,229, filed on Dec. 19, 1994, now abandoned.

(51) Int. Cl.$^7$ ................ G03C 5/10; G03C 5/56
(52) U.S. Cl. ............ 430/395; 430/321; 430/324; 430/5; 438/697; 216/38
(58) Field of Search ................ 430/5, 395, 321; 430/324; 216/38, 39; 438/697

(56) References Cited

U.S. PATENT DOCUMENTS

| 3,887,808 | * | 6/1975 | Van Den Houte et al. | 430/395 |
| 4,355,892 | * | 10/1982 | Mayer et al. | 355/67 |
| 4,373,810 |   | 2/1983 | Shreve | 356/226 |

(List continued on next page.)

FOREIGN PATENT DOCUMENTS 63-247753  * 10/1988 (JP) .

OTHER PUBLICATIONS

Booth et al."A Statistical Approach to Quality Control of Non–normal Lithographic Overlay Distortion" IBM J. Res. & Development, vol. 36, pp. 835–844; (1992).

Yanof et al. "Overlay Measurement and Analysis of X–ray/Optical Lithography for Mix–and–Match Device Applications" SPIE Proc. 2194, pp. 36–50 (1994) p. 50 in the "Conclusions".

NIST; Solid State Technology, p. 18, p. 20 (Jan. 1994).

Nissan–Cohen, 1987 VLSI Symposium on VLSI Tech. Karaizawa, Japan.

Ito et al, "Submicrometer Pattern Correction for Optical Lithography," Hitachi Ltd., Musashi Workes and Hitachi Research Laboratories (1986) 9 Pages reprinted in Proc. SPIE vol. 922 pp 9–17 (1988).

A. Starikov, Use of A Single Size Square Serif for Variable Print Bias Compensation in Microlithography: Method, Design and Practice, SPIE vol. 1088, Optical/Laser Microlithography II (1989) pp 34–46.

Henderson et al., "Optical Proximity Effect Correction: An Emerging Technology", Microlithography World (Summer 1994) pp. 6–8, 10–12.

Brooks et al, Procedure for Quartz Pattern Inspections IBM TDB, vol. 24, No. 6;11/81.

*Primary Examiner*—Martin Angebranndt
(74) *Attorney, Agent, or Firm*—Graham S. Jones, II; H. Daniel Schnurmann

(57) ABSTRACT

A pattern is formed on a substrate by the process of providing a substrate having a surface with previously patterned features having a non-uniform electromagnetic reflectivity, applying a second image recording material to the surface, employing the features with a non-uniform physical property of reflectivity to delineate a desired pattern in the second image recording material and applying electromagnetic energy to take advantage of the reflectivity features to provide variable processing of the second material.

11 Claims, 14 Drawing Sheets

U.S. PATENT DOCUMENTS

| | | | | |
|---|---|---|---|---|
| 4,374,915 | * | 2/1983 | Ahlquist et al. | 430/22 |
| 4,379,833 | * | 4/1983 | Canaello | 430/325 |
| 4,418,467 | * | 12/1983 | Iwai | 430/22 |
| 4,557,797 | | 12/1985 | Fuller et al. | 430/312 |
| 4,679,942 | * | 7/1987 | Suwa et al. | 356/401 |
| 4,744,666 | * | 5/1988 | Oshida et al. | 356/401 |
| 4,906,590 | | 3/1990 | Kanetaki et al. | 437/52 |
| 4,906,852 | * | 3/1990 | Nakata et al. | 356/401 |
| 4,910,122 | | 3/1990 | Arnold et al. | 430/313 |
| 5,110,697 | | 5/1992 | Lamb et al. | 430/14 |
| 5,130,229 | | 7/1992 | Chang et al. | 430/312 |
| 5,454,906 | * | 10/1995 | Baker et al. | 216/66 |
| 5,879,866 | * | 3/1999 | Starikov et al. | 430/395 |

* cited by examiner

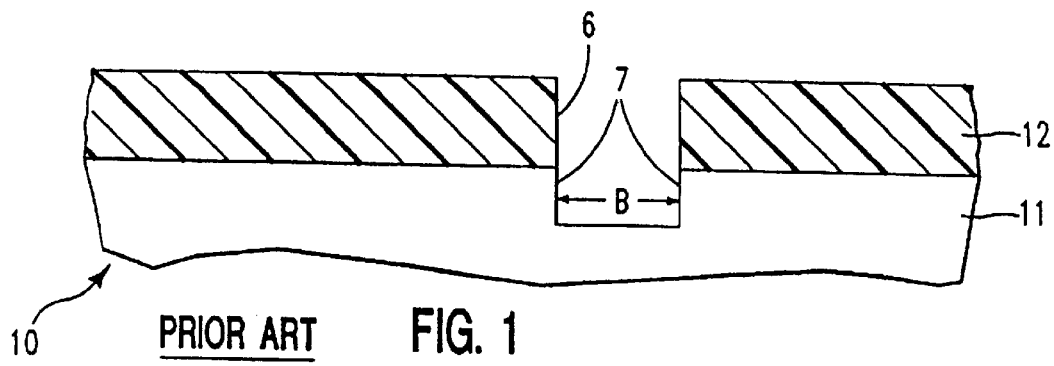
PRIOR ART FIG. 1
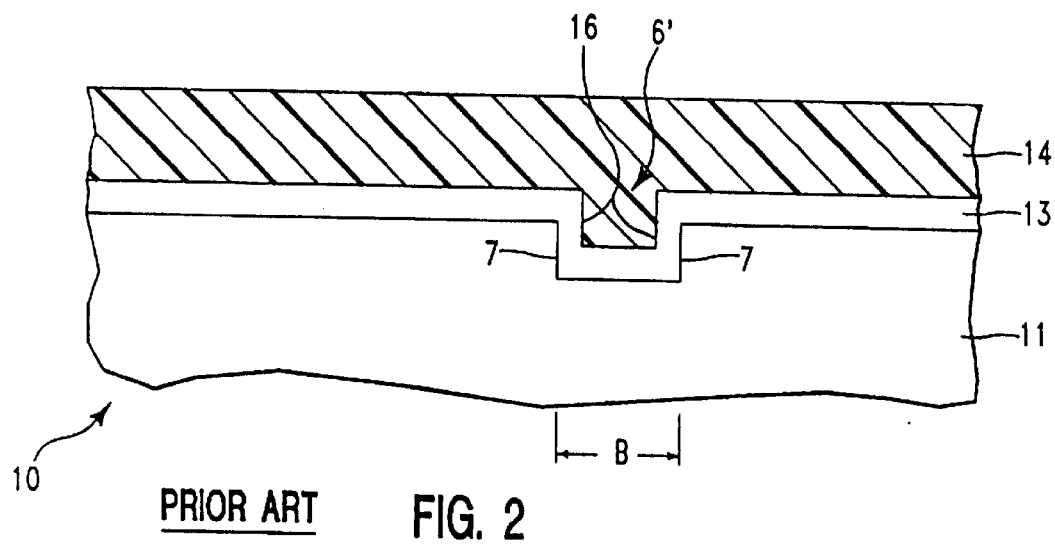
PRIOR ART FIG. 2
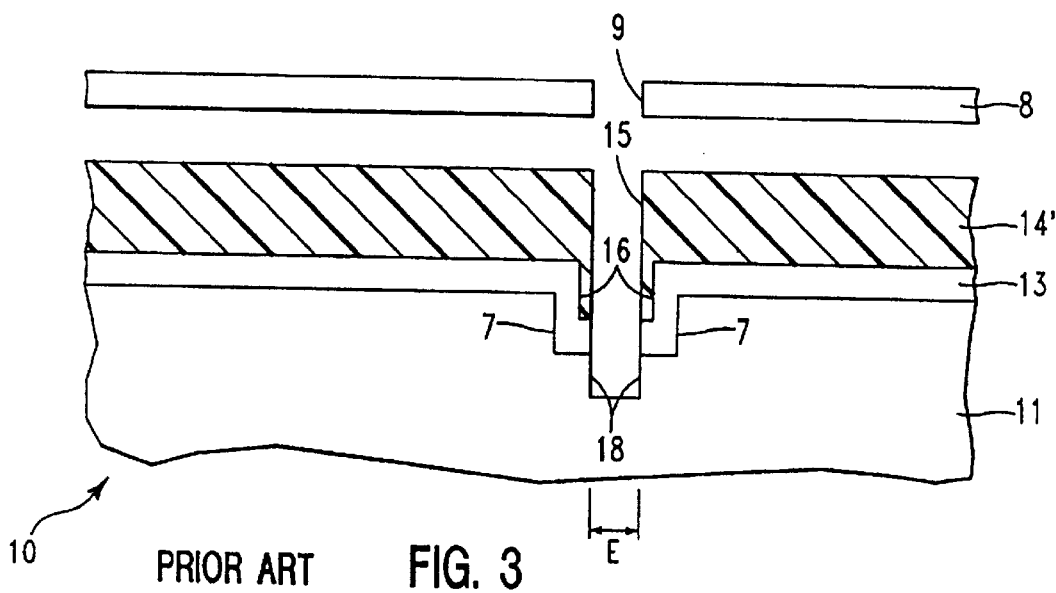
PRIOR ART FIG. 3

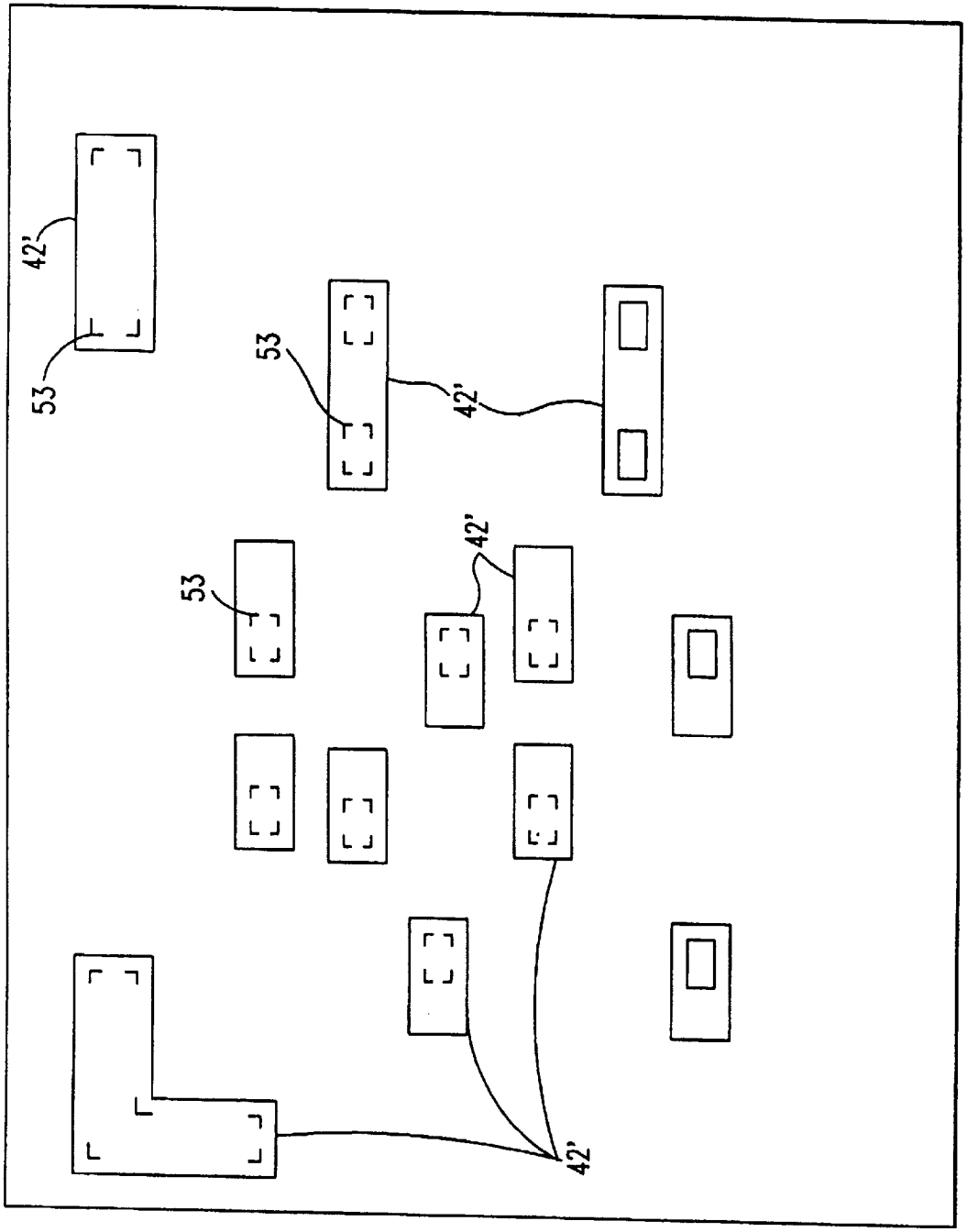

MULTI-LAYER INTEGRATED IMAGING/ IMAGE RECORDING PROCESS WITH IMPROVED IMAGE TOLERANCES This application is a divisional of Ser. No. 08/873,263, filed Jun. 11, 1997, now U.S. Pat. No. 5,879,866, which is a Continuation of Ser. No. 08/359,229, filed Dec. 19, 1994, now abandoned.

BACKGROUND OF THE INVENTION

1. Field of the Invention

This invention relates to image recording processes and more particularly to employing self-correcting processes of forming images in connection with photolithography of multiple images aligned to each other or a like process akin to printing onto a previously imaged substrate.

2. Description of Related Art

FIGS. 1–3 show a perfect process flow, in the prior art, for manufacture of a device 10. The intent here is to sequentially produce two images leading to formation of two openings in semiconductor layers. Typically a spatial relationship between the edges of two openings in overlaying imaging levels is to be reproduced to tight manufacturing tolerances.

Referring to FIG. 1, in the practice of prior art a device 10 is formed on a semiconductor substrate 11, which is shown with a photoresist etch mask 12 formed thereon with an opening 6 therethrough which was used to form a hollow opening B with sidewalls 7 in the substrate 11 by anisotropic etching.

Referring to FIG. 2, the device 10 of FIG. 1 is shown after the mask 12 has been removed from substrate 11 and a film 13, e.g. an oxide layer, has been formed by any method desired (that narrows down the width of opening B) to form a narrower opening 6' with sidewalls 16 centered on opening B. This image modification is achieved strictly by process means. As a result, this derivative image defined by sidewalls 16 of opening 6' is self-aligned to the opening B with sidewalls 7 and it maintains the same center as opening B, as well as replicating the shape of B in an inward direction while retaining excellent centerline level-to-level overlay component of edge-to-edge overlay. Then a new blanket photoresist layer 14 has been formed on the device 10 covering dielectric film 13.

Then a new photolithographic image of opening 9 in an optical mask (or reticle) 8 is formed by exposing photoresist layer 14 of FIG. 2 and developed into a well opening 15 in photoresist mask 14' as seen in FIG. 3. The photo-resist layer 14 of FIG. 2 has been formed into a photoresist etch mask 14' of FIG. 3 with the pattern for an opening 15 above the opening B. The photoresist etch mask 14' is used to etch opening E (with sidewalls 18) in the film 13 and, possibly, substrate 11 (as illustrated in FIG. 3). Level-to-level, edge-to-edge overlay in the plane of the top surface of the substrate 11 of the opening 15 (in resist etch mask layer 14') with the opening B limited by sidewalls 7 or with its derivative defined by sidewalls 16 is critical.

In order to maintain tight production control of this edge-to-edge overlay, dimensions of features in both masking levels and level-to-level centerline overlay must be simultaneously controlled. FIG. 3 illustrates perfect overlay of the openings E and B in the substrate 11, as desired in an ideal result.

FIG. 4 shows a typical problem with practicing the prior art approach of FIGS. 1–3. Specifically the centerline level-to-level overlay error is illustrated, where, at the time of exposure, the opening 9 in mask 8 is misplaced to the left from its intended position. The result is formation of opening 15' in photoresist layer 14', also misplaced to the left, and a subsequent etching of opening 18' (E) into the substrate 11 with encroachment on the left sidewall 16 of well B formed by film 13. In other words, because of misalignment of opening 9 in mask 8 with opening B in substrate 11, its image defined by sidewalls 15' in the photoresist 141 has been produced too far to the left. An error of making the width of opening 9 in mask 8 or of its image 15' in the photoresist 14' too large would lead to a similar problem.

When tight tolerances of level-to-level centerline overlay and linewidth (critical dimension, CD) for both openings B and E are not maintained, opening E may be defined outside of the region bounded by sidewalls 16" of film 13 within opening B, resulting in a device malfunction.

Making an opening E is a new patterning step which, in the present state of the art, does not take account of the existing (previously patterned on substrate) pattern B. At the most, measures are taken to suppress influence of the prior pattern on the new pattern formed, as in antireflection coatings, dyed photoresist, multilayer photoresist systems, surface imaging, etc., which are all expensive enhancements for the problem of opening (image) E size definition or tolerancing, each detrimentally affected by the existence of prior pattern B.

Using all of the above art does not overcome the underlying problem of proper image size and centerline overlay control, concurrently, in many imaging layers (which leads to device malfunction.) While these approaches mitigate the problem, they do it in an unsatisfactory way, because of the unacceptable levels of complexity and expense. The existing imperfections in masks(reticles) and printing machines (image distortion) and image size variation in the prior layer containing opening B and the new imaging layer (containing opening E) are not even addressed. The prior art is based upon the philosophy of control of all tolerances individually (for definition of typical current practices of prior art see Booth et al., "A Statistical Approach to Quality Control of Non-normal Lithographic Overlay Distortion", IBM J. Res. Develop., Vol. 36, pp. 835–844; 1992).

Maintaining the required lithographic tolerances is a difficult task which requires ever increasing complexity of microlithographic masks and printers, processes, metrology, etc. and, hence, is becoming economically unjustifiable. For a current account of overlay difficulties, see Yanof et al. "Overlay Measurement and Analysis of X-ray/Optical Lithography for Mix-and-Match Device Applications" SPIE Proc. 2194, pp. 36–50 (1994) page 50 in the "Conclusions", where it is stated that the overlay errors in optical to X-ray matching are as large as 60–70 nm from x-ray mask distortion alone, with distortion of optical mask and printer being comparable in magnitude (and additive in the practice of the prior art).

Edge-to-edge overlay (separation) of opening E with reference to opening B is critically dependent on centerline level-to level overlay (O/L) and on tolerances of linewidth (critical dimension, CD) for both openings B and E. In the prior art, a tight control of CD for both the openings B and E, as well as O/L of the opening E upon the opening B are individually maintained as is demanded by the market place, and accordingly, there is no alternative to that approach. The unacceptable alternatives are relaxed device ground rules which would result in non-competitive (slow, much energy consumption) or use of processes unable to support the required dimensional control and resulting in manufacture of unreliable devices.

SUMMARY OF THE INVENTION

An object of this invention is to employ any physical characteristics of a previously patterned feature to better form a new pattern in the course of an imaging process and associated image recording process.

The practitioner of this new art is invited to utilize the simplest imaging techniques which are inexpensive and easy to control to tight tolerances, as opposed to those techniques that are both complex and difficult to control, to achieve a desired result. The practitioner uses a larger number of steps which are individually simpler to execute. As a reward for patience, diligence, adaptation to the laws of nature, the user can achieve results that are otherwise impossible, while using existing technology. As the nearest analog to what is being proposed, lithography of the school of artist Suzuki Harunobu (Japan, 1725–1770) is cited, where up to ten levels of aligned (color) lithography have been inexpensively executed to mass-produce Ukiyo-e (mirror of the floating world) woodblock prints, using the fullest technology of the day.

In accordance with this invention, a process for forming a pattern on a substrate includes several steps. A substrate has a surface with features having non-uniform electromagnetic reflectivity. An image recording material is applied to the surface. The features are employed with non-uniform reflectivity to delineate a desired pattern in the second image recording material and applying electromagnetic energy to take advantage of the reflective features to provide variable processing of the image recording material.

In accordance with another aspect of this invention, a process for forming a pattern on a substrate comprises providing a substrate having a non-planar surface with topological features, treating the topological features to be responsive to any medium or property so as to delineate a desired pattern taking advantage of the medium or property associated with the topological features, and activating the medium or property to define the pattern. Preferably, the substrate is a semiconductor wafer having an existing pattern with non-planar topology or non-uniformly reflective features on the surface, treating the substrate by applying an anti-reflective coating to delineate the desired pattern on the non-planar substrate surface, the medium or property being an optical exposure phenomenon which is activated by illuminating the non-planar surface.

In accordance with this invention, a process for forming a pattern on a substrate comprises a) providing a substrate having a surface with features having non-uniform physical property defined by the previous pattern of the substrate, b) applying a image recording material to the surface, c) employing the features with a non-uniform property to delineate a desired pattern in the image recording material and applying an image recording process to take advantage of the reflective property to provide variable recording ability of the material.

The process for forming a pattern on a substrate comprises: a) providing a substrate having a non-planar surface with topological features defined by a previous pattern, b) treating the topologial features to be responsive to any medium or property so as to delineate a desired new pattern taking advantage of the medium or property associated with the topological features defined by the previous pattern, and c) activating the medium or property to define the new pattern.

Preferably, the process patterning a mask with another mask whereby self-corrected matched masks are provided; or a) the substrate is a semiconductor wafer having an existing pattern and non-planar topology or non-uniformly reflective features on the surface, b) treating the substrate by applying an anti-reflective coating to delineate the desired pattern on the non-planar substrate surface, and c) the medium or property being an optical exposure phenomenon which is activated by illuminating a new pattern onto the non-planar surface, taking advantage of the previous pattern.

A process for forming a pattern on a substrate comprises providing a substrate having a surface with physical non-uniformities previously patterned thereon, treating the non-uniformities to be responsive to a trigger mechanism to delineate a desired pattern taking advantage of the non-uniformities, and activating the trigger mechanism to define the pattern.

Preferably, the substrate is a workpiece having an existing pattern of non-planar features on the surface of the substrate, wherein the step of treating includes applying an anti-reflective coating to delineate the desired pattern and wherein the trigger mechanism is an optical exposure tool which is activated by illuminating the pattern.

Preferably, the features comprise a one dimensional grating with non-uniform reflectivity produced by an interferometric process, whereby a complementary grating is imaged onto the substrate and recorded so as to take advantage of the reflectivity; the treating comprises adjustment of depth in the topography; the treating comprises adjustment of depth in the topology so as to result in a maximum reflectivity within a portion of the topology and a minimum reflectivity outside of the portion; wherein the pattern comprises a one dimensional grating with non-uniform reflectivity produced by an interferometric process, whereby a complementary grating is imaged onto the wafer and then patterned to take advantage of the reflectivity; wherein the pattern comprises a one dimensional grating with non-uniform reflectivity produced by an interferometric process, whereby a complementary grating is imaged onto the substrate and then patterned to take advantage of the reflectivity; the non-uniformity of a physical response is triggered by presence or absence of a physical response by the workpiece to a trigger; the trigger comprises applying a voltage to the workpiece during electroplating thereof so the functional pattern of the workpiece transmits a voltage to the surface being electroplated; the trigger comprises an E-beam writing procedure by charge buildup in selected areas; or the trigger comprises a light emitting device in the substrate covered with a layer of photoresist upon the substrate wherein the light emitting device exposes the photoresist to activate the trigger mechanism.

In accordance with another aspect of this invention, a process for forming a two dimensional grating substrate having properties, the substrate being coated with a first layer of photoresist comprises imaging a first image comprising a one dimensional grating on the substrate, recording the one dimensional grating in the first layer of photoresist, modifying a property of the substrate with the first layer of photoresist with the recorded one dimensional grating, applying second layer of photoresist, imaging a second image comprising a complementary one dimensional grating on the substrate, recording the complementary one dimensional grating in the second layer of photoresist, whereby a two dimensional grating is produced on the substrate taking advantage of the modification of a property of the substrate predicated by the first image.

Preferably, the grating is treated by the process of modification of printing ability of the first and second layers of photoresist; and the topology is an edge and the treatment comprises deposition of a conformal opaque reflecting coating and adjustment of the depth in the topography.

Preferably the two dimensional grating patterned on the substrate is treaded by the process of modification of printing ability and layer of photoresist deposited onto the substrate is illuminated with an image in the shape of at least one outline to pattern at least one bounded array of features comprising the two dimensional features in the photoresist, taking advantage of the modification of printing ability.

BRIEF DESCRIPTION OF THE DRAWINGS

The foregoing and other aspects and advantages of this invention are explained and described below with reference to the accompanying drawings, in which:

FIGS. 1–3 show a perfect process flow, in the prior art, for manufacture of a device.

FIG. 6 shows an opening with sidewalls in the substrate of a device, which opening B was defined by standard photolithographic means and a blanket covering of a layer of an antireflection coating (ARC) partially planarized over the opening or depression, and as the result of planarization, thickness $t^B_{ARC}$ over the opening is greater than the thickness $t^S_{ARC}$ (S for stationary in the sense that it is a reference value compared to the perturbation presented by opening B) over large flat areas.

FIG. 7 shows the device of FIG. 6 after a subsequent partial ARC planarization by means of a planarization step, including a superficial blanker etching removal step.

FIGS. 8 and 9 show the device of FIG. 7 after a subsequent conventional coating with a thin film single layer photoresist (SLR).

FIG. 19B illustrates some potential misplacements of the features in FIG. 19A when the CD and centerline controls are not adhered to.

FIG. 19C illustrates the pattern of the "easy" level of the pattern of FIG. 19A.

DESCRIPTION OF THE PREFERRED EMBODIMENT

This embodiment relates to the modification of the printing ability of a photoresist achieved as the result of a physical property of the pattern defined in a material deposited in or on a substrate.

Figure 4:
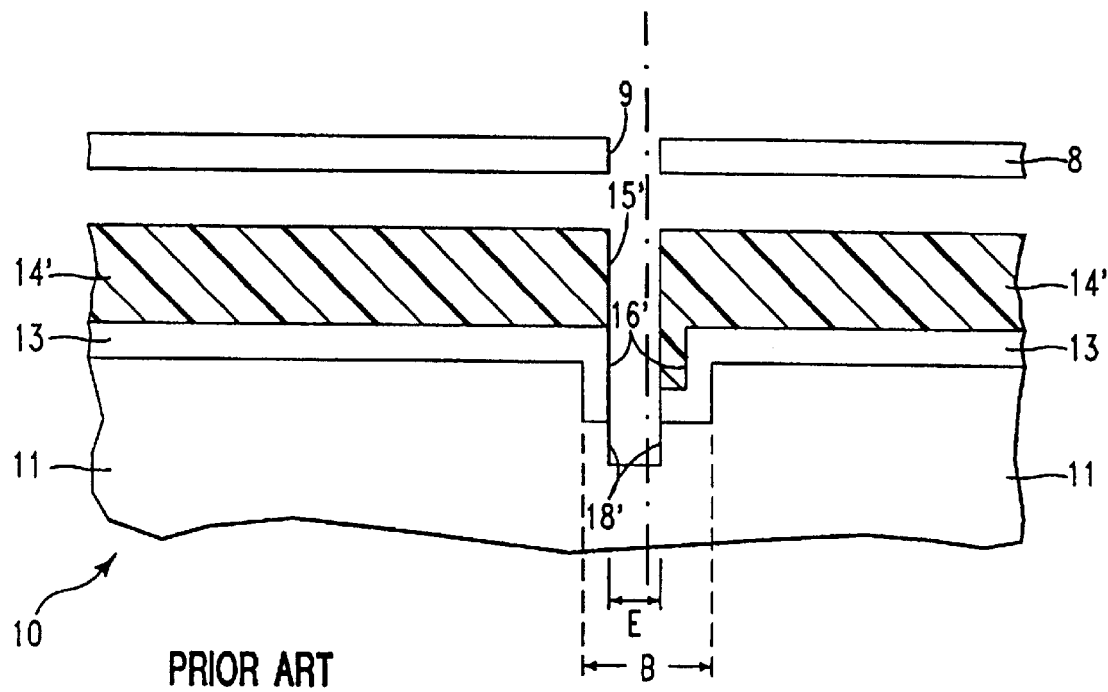
FIG. 4 shows a typical problem with practicing the prior art approach of FIGS. 1–3.
Figure 5:
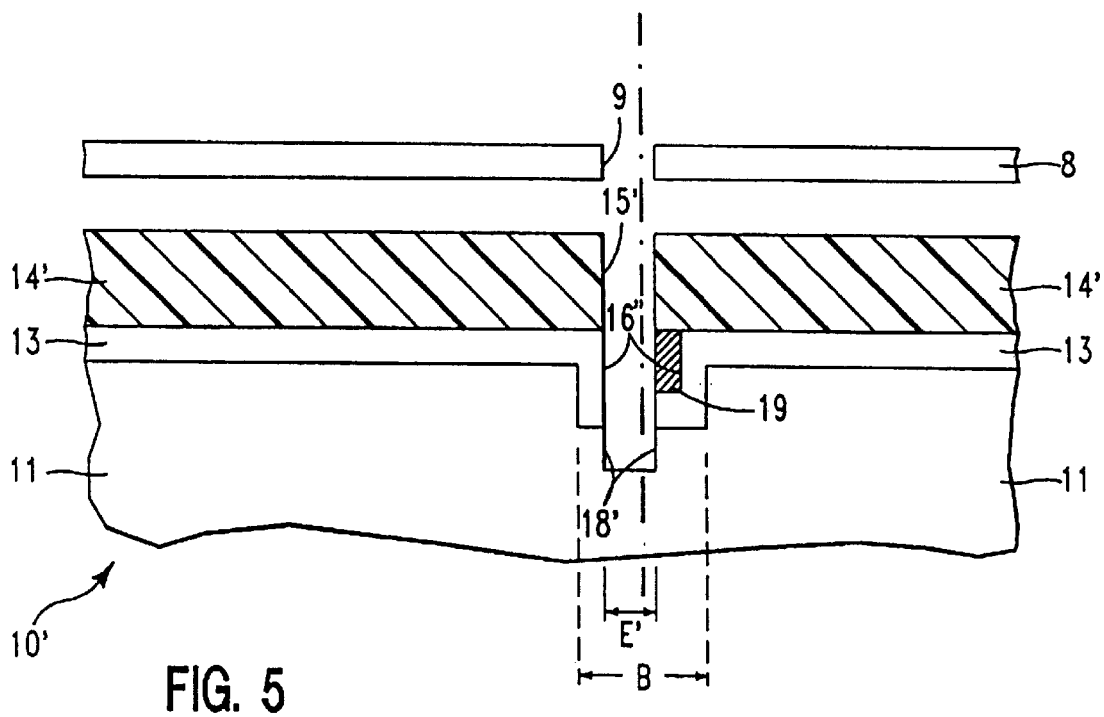
FIG. 5 shows a device made in accordance with this invention having the desired feature of self-correction of resist etch mask opening.

FIG. 5 shows a device 10' made in accordance with this invention having the desired features. Although device 10' is made in the same configuration as in FIG. 4, Prior Art, between the mask opening 9 in relationship to opening B in the substrate, self-correction of resist etch mask opening 15' has been achieved with the following result. The left hand sidewall 16" of the layer 13 in opening B is now undamaged by etching while the width of the opening E' has increased somewhat. In other words, error of misalignment of image of opening 9 in mask 8 in FIG. 4 has been compensated by a change in position of the center and the width of opening 15' in FIG. 5.

FIGS. 6–9 show a practical example of a process flow, in accordance with this invention for manufacture of a device 20.

Figure 6:
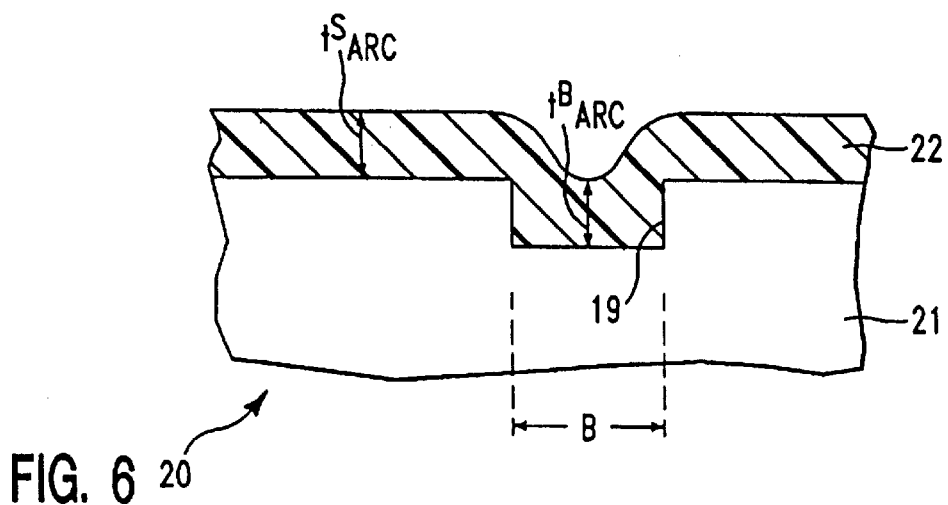
FIGS. 6–9 show a practical example of a process flow, in accordance with this invention for manufacture of a device.

FIG. 6 shows the opening B with sidewalls 19 in semiconduction substrate 21 of a device 20. Opening B was previously defined, by steps not shown, by standard photolithographic means. Device 20 with opening B is covered by a layer 22 of an antireflection coating (ARC) partially planarizing over opening or depression B. As the result of planarization, thickness $t^B_{ARC}$ over opening B is greater than the thickness $t^S_{ARC}$ (S for stationary in the sense that it is a reference value compared to the perturbation presented by opening B) over large flat areas.

Figure 7:
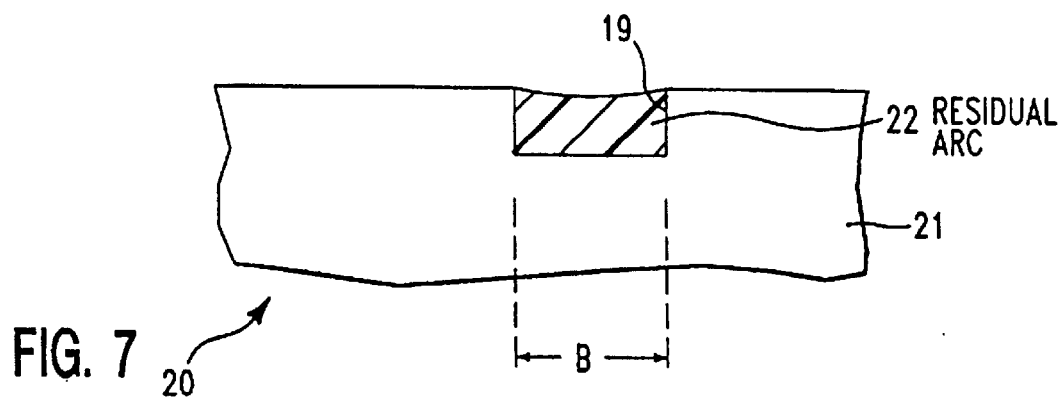

FIG. 7 shows the device of FIG. 6 after a subsequent partial ARC superficial blanket etching removal step. The planarization can be achieved by an etchback technique or $O_2$ ashing which planarizes the device of topography B, bringing the antireflective coating (which will serve as an absorber for radiation applied thereto) down to the level of the top of substrate 21. Thus, the opening B remains covered by an antireflective coating ARC. The thickness over large flat areas of the antireflective coating comprises $t^S_{ARC}$. The extent of etchback/ashing must be adjusted as needed to:

a) assure partial initial planarization of the ARC over opening B, and b) complete removal of the antireflective coating of a thickness $t^S_{ARC}$ over large open areas which is neither an unusual nor difficult process step and with the thickness of the residual ARC being non-critical.

Due to significant differences of the antireflective coating thickness over opening B compared to the relatively elevated areas surrounding it, $$t^B_{ARC} > t^S_{ARC}$$

is always experimentally achieved, as needed.

Figure 8:
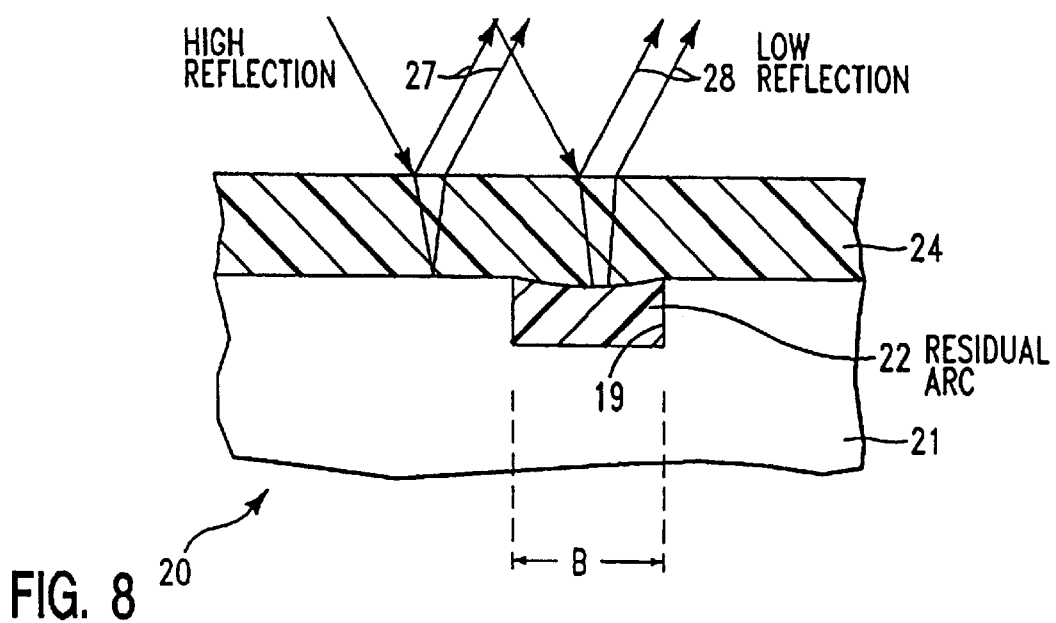

FIGS. 8 and 9 show the device of FIG. 7 after a subsequent conventional coating with a thin film Single Layer photoResist (SLR) 24. Referring to FIG. 8, one may have to adjust thickness of photoresist layer 24, so that SLR has maximum reflectivity (due to interference in the SLR of narrow range of wavelengths in the thin film) over the top surface of substrate 21 so that the photoresist 24 is minimally exposed over the relatively elevated areas of substrate 21 lying outside of depression B in FIG. 8.

In an alternative embodiment, the SLR layer 24 over flat areas of the substrate 21 has minimal reflectivity (antireflectivity) to result in the resonant enhancement of light enhancement absorption in those areas. In either embodiment the goal is to enhance printability in one designated area and to stabilize or suppress printability in the adjacent one.

Control of SLR thickness is essential for practicing a particular form of image self-correction and it is conventionally controlled by the present state of the art to the tolerance that would be required in this embodiment.

The reflectivity over area B is lower due to absorbing ARC layer 22 remaining in the depression B. Therefore, the same exposure time leads to an effectively larger dose in this area as compared to the surrounding area. When an exposure is made for the purpose of forming a new opening in photoresist 24 over prior pattern B, any regions inadvertently exposed outside of the boundaries of depression B are underexposed. As the result, the edges of the desired new opening in that area are pulled in towards region B and the effective image correction is achieved in a desired fashion. Such image self-correction is a result of interaction of the process of the lithographic imaging of one pattern into a recording medium (resist 24) whose recording property has been modified in a manner predicated by a physical property of a prior patterned layer.

Figure 9A:
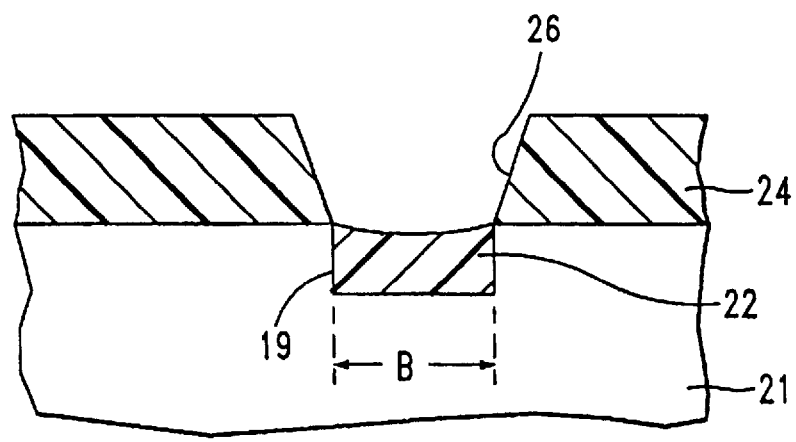

FIG. 9A illustrates an opening 26 in photoresist 24 formed over opening B modified by residual ARC layer 22 by a blanket light exposure (at least in the area shown) over the entire region. Resist thickness and exposure time are adjusted just so that only the photoresist 24 over the ARC layer 22 is exposed in excess of a threshold required to lead to photoresist solubility by developer. The photo-resist layer 24 has been removed in region 26 as a result of the heavy absorption of the light in layer 22 beneath it. In summary, the device opening 26 is exposed over the ARC layer 22 remaining in the opening 26 for region B because the light is absorbed by the layer 22.

A highly regular array of square or rectangular identical openings B in the x and y directions on the substrate 21 may be formed to be used as in FIG. 9A to initialize definition of a new pattern by a relatively coarse and not as well controlled exposure of a limited array or arrays. This is applicable to the most competitive, critical and important aspect of application in the manufacture of IC's such as memory devices, gate array devices, and logic devices.

Figure 9B:
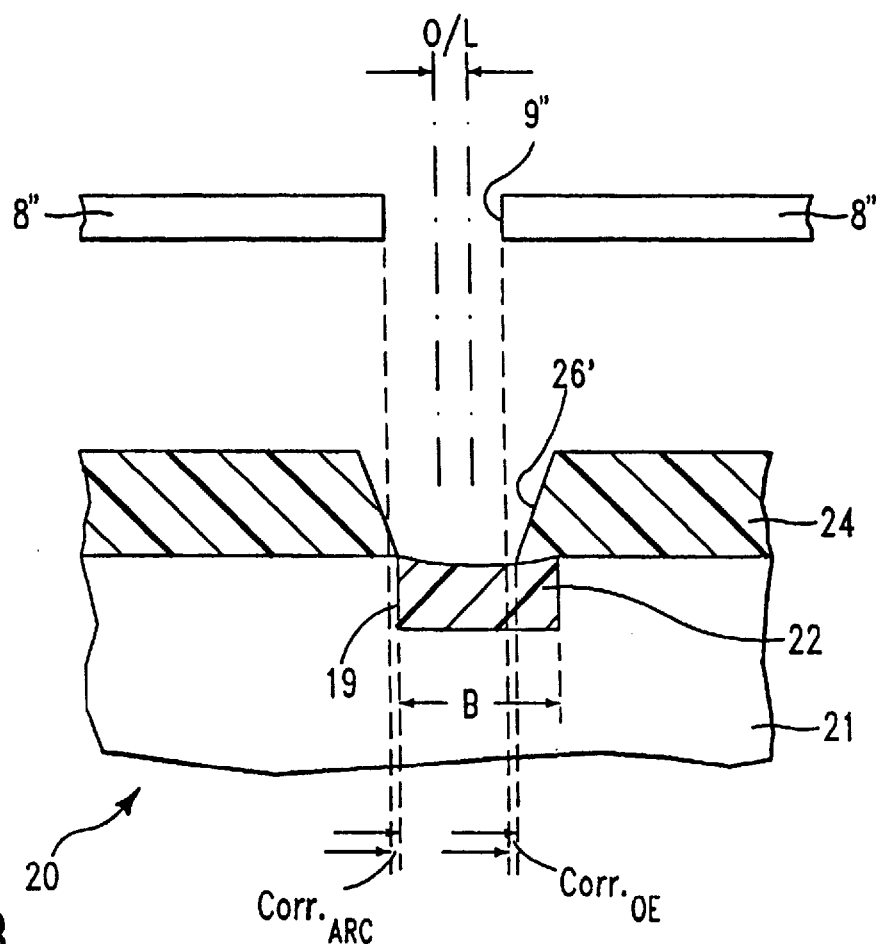

FIG. 9B is another modification of the process forming the device of FIG. 9A illustrating formation of the opening 26' in photoresist 24. In this case an aligned high quality image of opening 9" in mask 8" is attempted over region B in the presence of misalignment to the left by magnitude O/L in opening 9" with respect to opening B. As the result of the mechanism described in connection with FIG. 9A, as shown by $CORR._{ARC}$ in FIG. 9B, self-correction of the left edge of opening 26' toward the right will occur on the edge of the ARC while the right edge of opening 26' will print over ARC-filled opening B. In order to both achieve selfcorrection of overlay of opening 26' with respect to opening B and retaining its size (Critical Dimension, CD, linewidth), a slight overexposure may be used to set nominal print with a small positive bias (oversized opening). That moves the printed right edge of opening 26' further to the right, as shown in FIG. 9B by $CORR._{OE}$ In FIGS. 9A and 9B, the photoresist 24 has been formed into a mask 24. In order to make use of SLR interference effects, as used in this particular embodiment for the practice of self-corrected optical lithographic printing, the condition must be satisfied as follows:

$2 \cdot nT \leq \delta$ where
T is the photoresist thickness.
n is the refractive index of the photoresist.
δ is the coherence distance in vacuum due to both temporal and spatial coherence.

A light source with a narrow optical bandwidth may have to be used to provide selective exposure of the photoresist 24. For example a mercury arc light source can be used with a G, H, or I line. Alternatively, an excimer laser can be used to provide a substantially monochromatic, partially coherent light source. The thickness of the photoresist 24 is selected to match the wavelength of the light source directed upon the device 20 as illustrated by beams 27, 28 in FIG. 8. High reflectivity of beams 27 is realized due to destructive interference of actinic light on the thin film outside region B, leading to low effective exposure of SLR there.

Whenever, due to failure of critical dimension (CD) control of mask opening 9 in FIG. 5, substrate opening B or due to excessive overlay error of opening 9 in reference to opening B, edges of the emitter land outside of the edges of the opening B. In that case, the dose coupled into the photoresist 24 is small and a pull-back towards opening B occurs. For modern photoresists, the effect can be 60 nm to 120 nm, for good focus, solely due to SLR swing from maximum to minimum reflectivity.

In the extreme case of execution of the proposed self-correction of printed images, as in FIG. 9A, the bottom pattern layer, any auxiliary self-aligning structures (e.g., sidewall insulator or whatever is suitable—by typical process driven self-alignment) etc., are put in. An imaging photoresist layer 24 is deposited but no aerial image of the actual next layer pattern is present. Rather, a blanket exposure or blanket exposure of selected regions is done to delineate a fully self-aligned by process means image of the next layer.

DEFINITION OF FINE LINE, LOW DISTORTION, IMAGE ARRAYS

Sequential use of fundamental principles in image self-correction can be used to produce novel, high performance, totally dedicated combination of process, lithography tools, and circuits.

A problem with such arrays is cost, performance, reliability, etc. (all competitive aspects of IC manufacture) are limited by the ability of microlithographic printers to produce dense arrays of the smallest features. While these arrays almost universally are highly repetitive (due to the repetitive nature of digital computing) the present day microlithographic printers are the direct extension of general purpose microphotography. They are analog systems best suited for reproduction of arbitrary shape continuous tone images. In order to print such images, design compromises have been made, resulting in many restrictions (numerical aperture, filling ratio, field of view, depth of focus etc.)

Conventional optical printers have delivered a remarkable sustained performance growth and increased productivity. However, these general purpose imaging systems have already become too complex, expensive and very difficult to advance further without additional gains from other fields: materials sciences, optics manufacturing, chemistry of deep UV photoresists, novel DUV light sources, etc.

Acceptance of non-general purpose lithographic approaches (phase masks, off-axis illumination, pupil filters etc.) and conventionally using all other technologies has already lead to extensions of the combined lithographic capabilities into next generations of IC products. Still, those who believe in practical optical microlithography at CD=100 $\mu$m see it as an extension by brute force.

This statement (general purpose imaging) is akin to statements of the lack of special adaptation, dedication, and hence, efficiency for the job at hand: to print some very limited types of high density periodic patterns such as storage nodes, gates, contacts, vias, wiring, etc. The essential property of such arrays is the repetitive similar features in arrays with very dense periodic or near periodic arrangements.

Since the demands of productivity, performance and quality are to be delivered only for very limited type of images, dedication of any and all of essential parts may lead to substantial gains.

Proposal

We introduce a set of restrictions, (conventions, secondary groundrules) on the shapes and arrangements of shapes in the circuits to permit the use of only those which are compatible with high process latitude images from simpler image forming apparatus combined with concepts of self-correcting lithography. This is shown to solve the stated problem.

There exist numerous specific applications, circuit types and process/printer arrangements. It is anticipated that the extreme proliferation of such low cost lithography, i. e. microlithography of ICs will lead to industry maturation and acceptance of such standard formats, configurations, sizes, etc. to take advantage of the lowest costs of industry-wide commonality, cross-compatibility, and global scale mass-production.

In addition, the potential advantages of this invention permit improvement of performance in terms of resulting image sizes and periodicity in well-defined lithographic images. For example, using optical lithography at the wavelength of 200 nm one can define circuit images with linewidths as small as approximately 40 nm (equal lines and spaces, L/S) and a pitch of about 80 nm. Neither one is presently available by optical means—and to do so with essentially unrestricted field size and depth of focus. The most difficult patterns are defined without masks. There are no issues of mask manufacture, inspection, or defect repaid. Very little distortion is introduced by the simple and traceable to fundamental standards printer. Such lithography may retain its utility into the future, where functionality of devices is limited by the basic material properties—not by the ability to pattern small and densely packed features.

A Typical Embodiment

To rephrase, this optical lithography should suffice for manufacture of integrated circuits in the foreseeable future.

The proposed practice of microlithographic manufacture predicated upon this invention is described below by a combination of the standard circuit shapes, image forming tooling, and processes.

A typical process sequence may begin with patterning the highest performance image, such as storage node (capacitor), gate or emitter. Alternatively, it can begin with the less demanding steps, followed by a lithographic step or steps described below.

Figure 10:
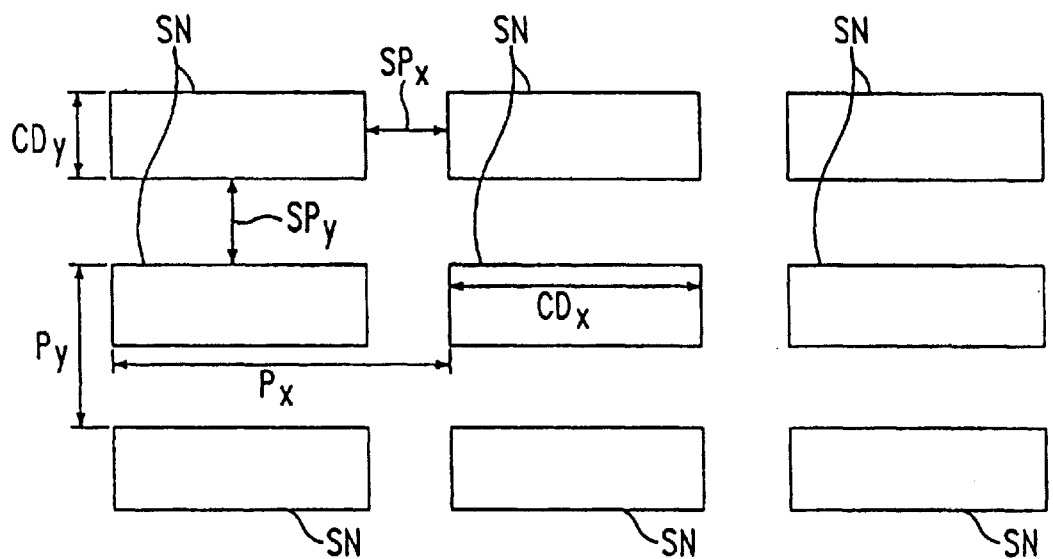
FIG. 10 shows a typical highest density pattern in an array.

Referring to FIG. 10, a typical highest density pattern in an array is shown. It is characterized by small periodicity Px and/or Py, as well as small critical dimensions (CD, linewidth, etc.) in either one or both axes. Each box is marked as a SN (storage node), but alternatively it can be an array of contacts, gates, wires, etc. as suits the application. More complicated patterns can be derived from the previous patterns by additional steps.

Definitions

CD is Critical Dimension, linewidth $CD_x$ is a line critical dimension along the x axis.

$CD_y$ is a line critical dimension along the y axis.

$SP_x$ is a space critical dimension along the x axis.

$SP_y$ is a space critical dimension along the x axis.

Periodicity $P_x$ is expressed as $$P_x = CD_x + SP_x$$

and periodicity $P_y$ is expressed as $$P_y = CD_y + SP_y.$$

The essential demand is to faithfully reproduce shapes and low image distortion of device arrays, while maintaining tight dimensional control. Economics also dictate simplicity and lowest possible expense.

These goals are best met by a combination of very simple steps.

Step I.

Pattern a one-dimensional grating with a periodicity on the entire wafer surface.

Figure 11:
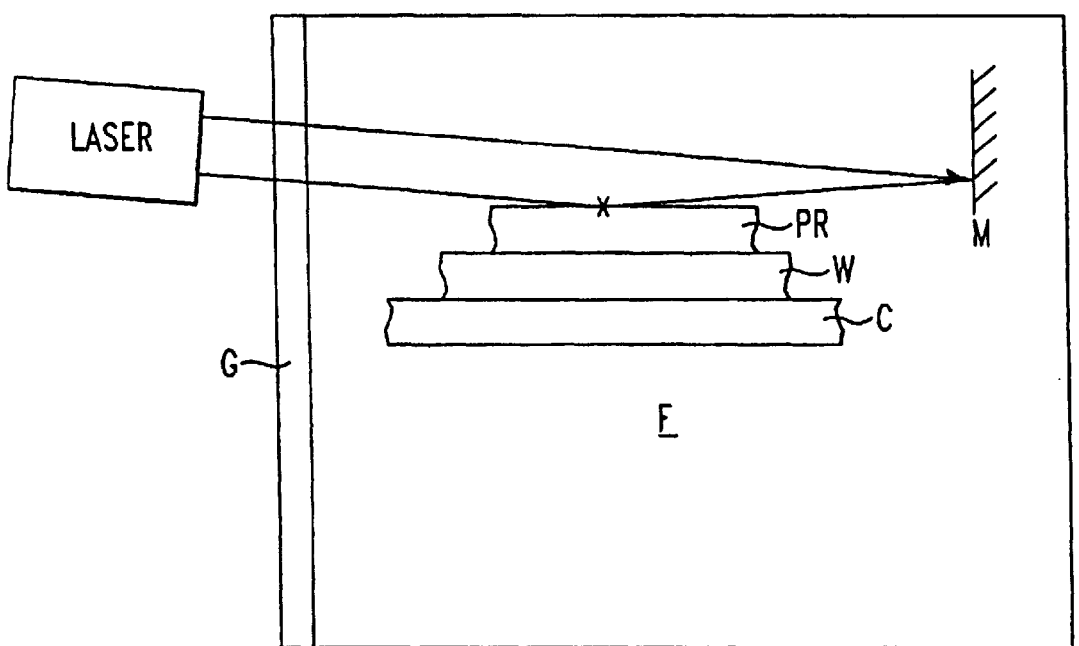
FIG. 11 shows a laser transmitting a beam through a window, a vessel filled with immersion fluid with the beam striking the top surface of photoresist carried on a wafer positioned on the surface of a chuck and stage.

One such step is depicted in FIG. 11 which shows a laser transmitting a beam through a window G, a vessel V filled with immersion fluid F (G, V and F are optional and used only when immersion lithography is desired.) The beam strikes the top surface of photoresist PR carried on wafer W, itself positioned on the surface of chuck and stage C. Spatial orientations of the laser, chuck C with wafer W and the mirror M are tightly controlled.

Figure 12:
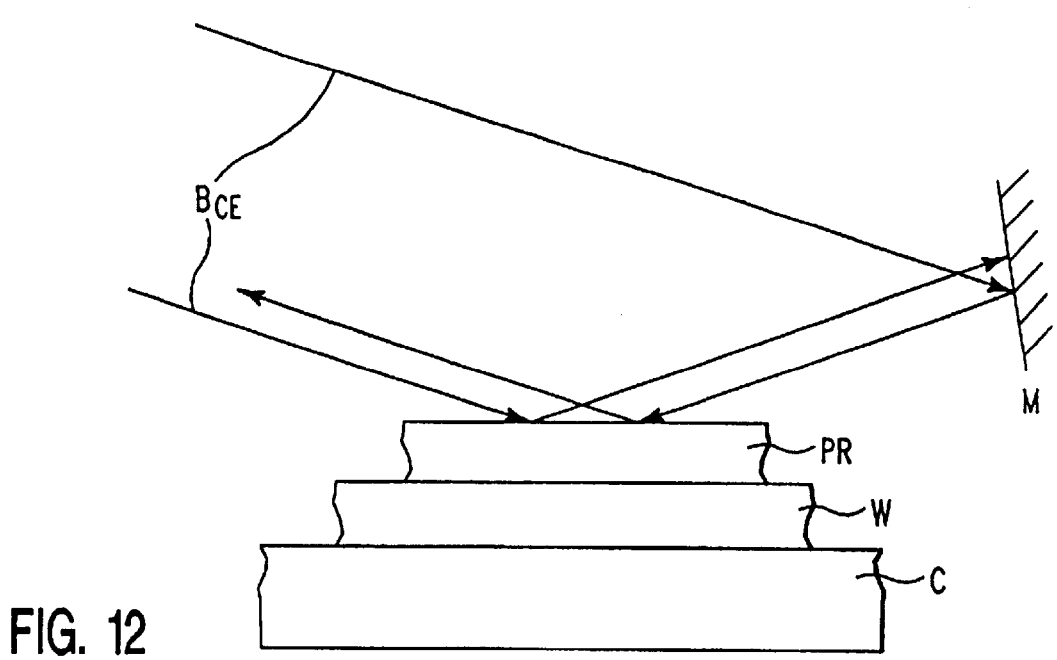
FIG. 12 shows a relatively flat photoresist layer with a collimated and expanded beam which is directed at an angle to the surface of photoresist layer, the upper portion of that beam striking a mirror which is upright and the upper portion of the beam being reflected back down upon the surface of the photoresist layer at an angle with the lower portion of the beam striking the photoresist layer and being reflected therefrom upon mirror and leaving the vicinity of the wafer.

FIG. 12 shows a relatively flat photoresist layer PR with a collimated, and expanded beam which is directed at an angle to the surface of photoresist layer PR. The upper portion of that beam strikes mirror M which is upright. The upper portion of the beam is reflected back down upon the surface of layer PR at an angle. The lower portion of the beam strikes the photoresist layer PR and is reflected therefrom upon mirror M and leaves the vicinity of the wafer W.

The uniform output intensity of a collimated beam (which may be expanded if desired) strikes photoresist PR on the top surface of wafer W, which is covered by photoresist PR. The upper portion of the same wavefront of collimated beam is reflected from the mirror M and then strikes the same portion of wafer W covered by photoresist PR. The result, owing to coherence, is a strong interference pattern with intensity I(x) as shown in FIG. 13.

Figure 13:
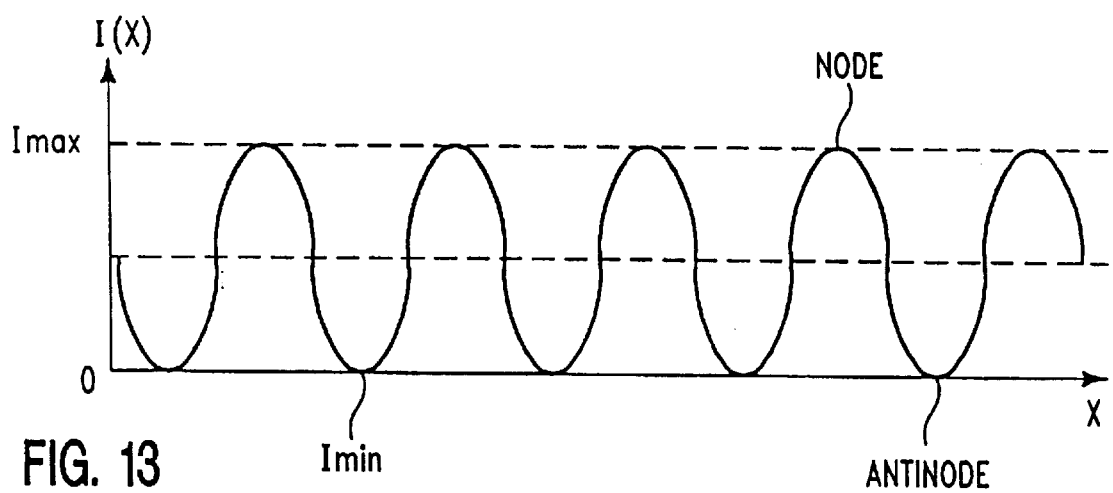
FIG. 13 shows a graph of an interference pattern I(x) as a function of the horizontal axis x with a minimum amplitude of $I_{min}=0$ which is the antinode, a maximum amplitude of $I_{max}$ which is the node.

FIG. 13 shows a graph of interference pattern I(x) as a function of the horizontal axis x with a minimum amplitude of $I_{min}=0$ which is the antinode, a maximum amplitude of $I_{max}$ which is the node.

1) Photoresist Process Latitude

The volume above the wafer W and photoresist PR is filled with the interference pattern.

Its contrast C is nearly 1 due to a high degree of spatial and temporal coherence and low losses in two portions of the beam converging upon the top surface of the wafer. Classic definition of contrast C is used and it yields the following expression:

$$C = \frac{I\max - I\min}{I\max + I\min} = \frac{I\max - 0}{I\max + 0} = 1$$

This is the largest possible contrast, and it is much higher than in any prior general purpose lithography, where a contrast as low as 0.5 may have to be tolerated and accommodated.

As a result, the photoresist image will have a high process latitude and steep sidewalls. The process latitude comprises the fact that there is great photoresist process latitude in terms of contrast, low variability of linewidth and sidewall angle vs. exposure dose, bake and developer temperature, etc.

2) Focus Latitude

Since the volume of interference node/antinode patterns extends up above the wafer, a high depth of focus results and leads to extreme tolerance to wafer non-flatness and tilt. The distance Delta Z (up/down) is used for comparisons. When the mirror M, wafer W and the laser deviate from perfect alignment, one result may tilt in the node/antinode pattern. Consequently, when a wafer is translated up/down or there is a non-flat portion on the wafer, the result is a change in the interference pattern upon a surface point. As the wafer translates in Z, a given point A on its surface encounters the same contrast after reversal having travelled distance Delta Z where:

Delta Z—(Lambda)/sin β, where (Lambda): is the wavelength of light
    β: is the angle of misalignment between the direction perpendicular -continued to the wafer surface and the planes of nodes/antinodes.

Even assuming a crude mirror, poor alignment, poor vertical stage straightness, combined to a net tilt of 1%, Delta Z–(Lambda)/1%=(Lambda)/0.01=100 (Lambda)

That is by far better than any conventional imaging with an estimate of defocus such as Raleigh distance (or twice /or that for end-to-end estimate:

2R=2(Lambda)/NA², where NA-Numerical Aperture

For example, when NA=0.5, 2R=4(Lambda)

That is, for a conventional optical system with Lambda= 200 nm, 2R–2×200 nm/0.5²=400/0.25=1600 nm. On the other hand, the simple system proposed here would have the "depth of focus"–100×Lambda=100×200=20,000 nm.

3) Distortion.

In addition to good image size control expressed in the prior two statements, the image across the entire wafer (chip or array) is spatially stable and has low distortion. Distortion is fundamentally limited only by the simple optics of the beam expander, flatness of the wafer and the mirror, and stage travel, if scanning is used. The flat optics, good to Lambda/50 are available, leaving only the beam expander (a simple device) to manufacture to tolerances demanded of multi-hundred-thousand dollar lithography lenses.

Alternative patterning methods to execute Step I above include immersion lithography illustrated in FIG. 11 with necessary elements being immersion fluid F, vessel V and window G. While the resolution of dry lithography is limited to pitch P<Lambda/2 or L/S of equal width to Lambda/4, for immersion lithography these expressions are P<Lambda/2n or L/S of equal width Lambda/4n. For example, assuming Lambda=200 nm, dry lithography would yield periods down to 100 nm or equal L/S of 50 nm. On the other hand, immersion in a fluid of refractive index 1.4 would produce periods as small as 72 nm or L/S of 36 nm.

One more alternative method utilizes immersion in solid high index of refraction optical medium similar to immersion in a liquid to produce the standing wave pattern. Multiple arrangements are available and are currently used to produce holograms. It is important to realize that, unlike the immersion in a semi-infinite vessel, waveguide mode pattern can be affected by the boundaries of the confined high index material. To suppress that., leaky modes can be excited. These can be coupled into and out of the high index transparent substrate using frustrated evanescent transmission. For the purpose of patterning lithographic images consider the arrangement illustrated in FIG. 14 where photoresist 30 is placed upon film to be patterned 31, which is in turn formed (or placed) on substrate 32 which is adapted to serve as a waveguide. Laser 34 delivers a collimated beam 35 to a coupling prism 33 placed in close proximity to the back side of substrate 32. Beam 35' forms the waveguide mode in the substrate slab 32 and will propagate upwards into the film to be patterned 31 and photoresist 30 to produce a one dimensional grating due to effects depicted in FIGS. 12 and 13. Typical applications could include manufacture of high resolution TVs, flat panel displays, thin film transistors and laser diode arrays. Assuming a $Si_{3N4}$ substrate 32, gratings with a period as small as 50 nm or equal L/S of 25 nm can be manufactured.

Other routes to produce a substrate with a grating pattern may involve some form of light-assisted processing, such as ablation, etching, or deposition. A fine Cr pattern with period of 213 nm has been recently produced (NIST; Solid State Technology, p. 18; January 1994) with an arrangement similar to that depicted in FIG. 12 by utilizing material deposition induced by atomic resonance interaction with the standing wave pattern of FIG. 13.

Result at the end of first step: a high quality grating is defined on the substrate.

Step II.

The essential feature of the proposed new art is to take advantage of the previous pattern on the substrate in order to modify printability of a subsequent level.

Figure 15:
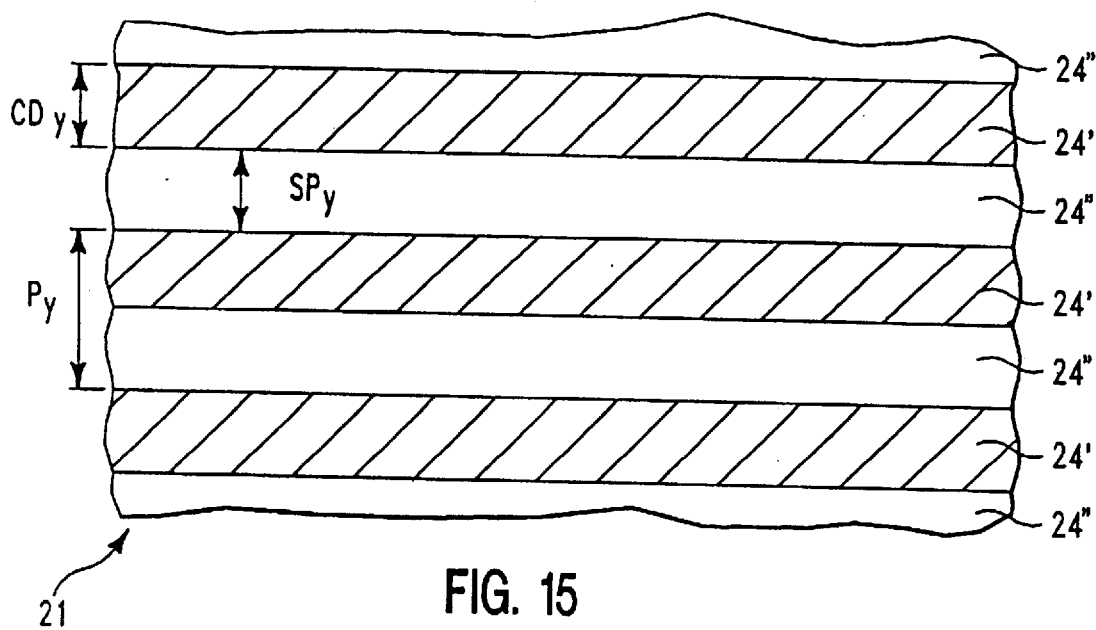
Referring to FIG. 15, to complete the pattern of FIG. 10, the process illustrated in FIGS. 6–8 is exercised resulting in a wafer with areas where printing has been enhanced, alternating with those, where printing is inhibited, with a mask, already defined on the substrate, for desired pattern dimension $CD_Y$ with periodicity $P_Y$.

Accordingly, to complete the pattern of FIG. 10, the process illustrated in FIGS. 6–8 is exercised. The result is a wafer with areas where printing has been enhanced, alternating with those, where printing is inhibited, FIG. 15. The mask for desired pattern dimension $CD_y$ with periodicity $P_y$ is already defined on the substrate.

Figure 16:
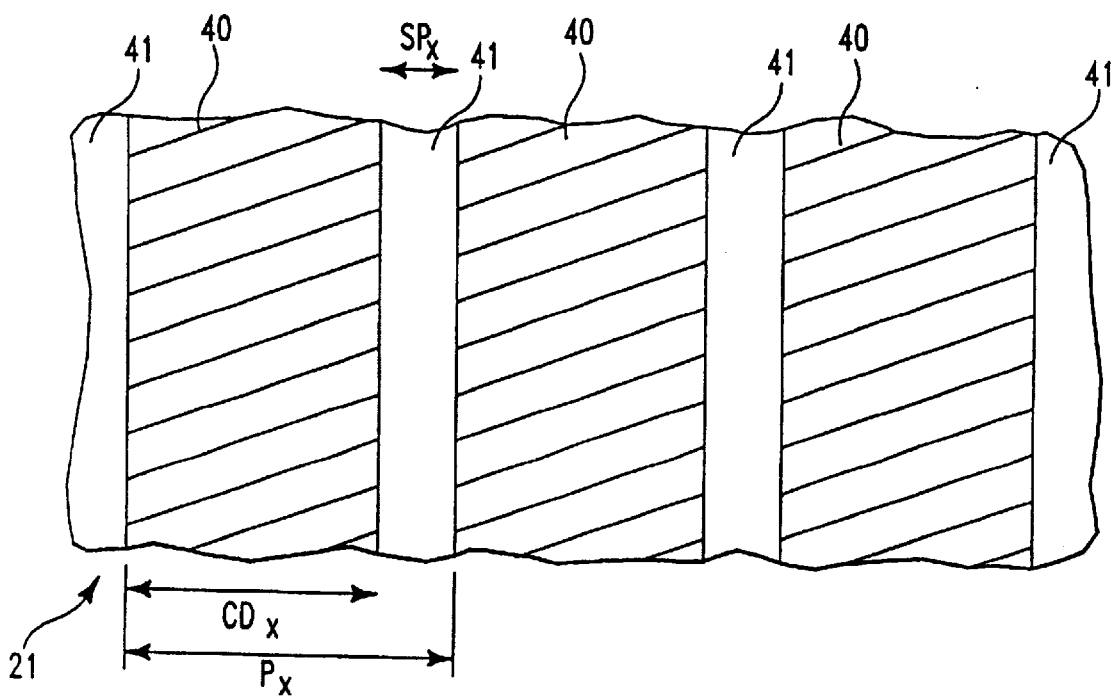
FIG. 16 illustrates the complimentary exposure pattern of a resist mask for the desired critical dimension $CD_X$ with periodicity $P_x$ as may be now defined using the same arrangement as FIGS. 11–13.

The complimentary exposure pattern of a resist mask for the desired critical dimension $CD_x$ with periodicity $P_x$ as illustrated in FIG. 16 may be now defined using the same arrangement of FIGS. 11–13. That would produce areas 37 of FIG. 17, where photoresist was exposed sufficiently to result in its solubility by developer. The other areas 38, 39, 40, on the other hand, would receive an effective lower dose coupled into photoresist. As explained in conjunction with FIGS. 8 and 9, this is due to the presence of ARC in substrate openings below photoresist and tuning resist thickness for best reflectivity over the surrounding areas.

Upon photoresist development and etching of the exposed ARC material, the bottom of substrate openings is uncovered and may be etched or otherwise processed to replicate pattern of FIG. 10 onto substrate.

Alternatively, the second (customizing) exposure of Step II is made on a conventional imaging system. This printer, illumination, and reticle are optimized to delineate the best image in photoresist in only one direction. This allows the lithographer to resolve the frequent topologic problems with present phase shifting masks (PSM) of several types, off-axis illumination, etc.

Since the exposed and developed photoresist of Step I is stable and no further use will be made of it as an imaging photoresist or a suitable film below it patterned, by RIE, is used, shelf life of primed blanks (after Step I) is excellent. Many alternative schemes can be used to mass produce such primed blanks as a standard and inexpensive commercial product. The eventual customers may make their first exposure at Step II, as it suits them, and using a compatible process to complete the image.

Figure 17:
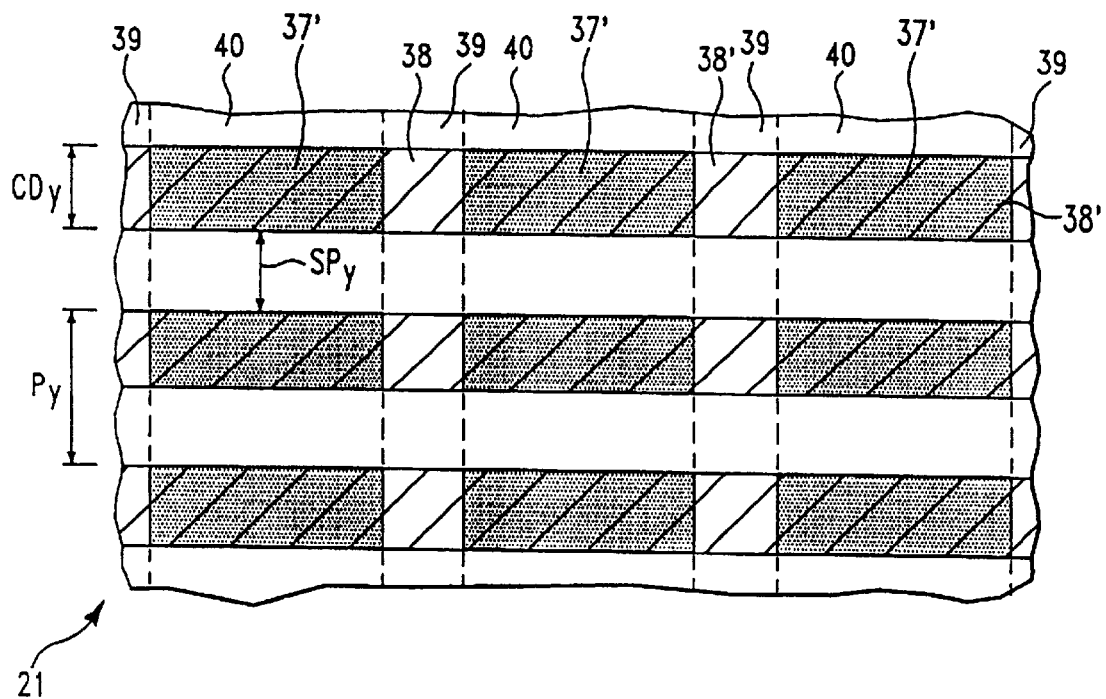
FIG. 17 shows areas where photoresist was exposed sufficiently to result in its solubility by developer, while other areas, on the other hand, would receive an effective lower dose coupled into photoresist, which as explained in conjunction with FIGS. 8 and 9, is due to the presence of ARC in substrate openings below photoresist and tuning resist thickness for best reflectivity over the surrounding areas.
Figure 18:
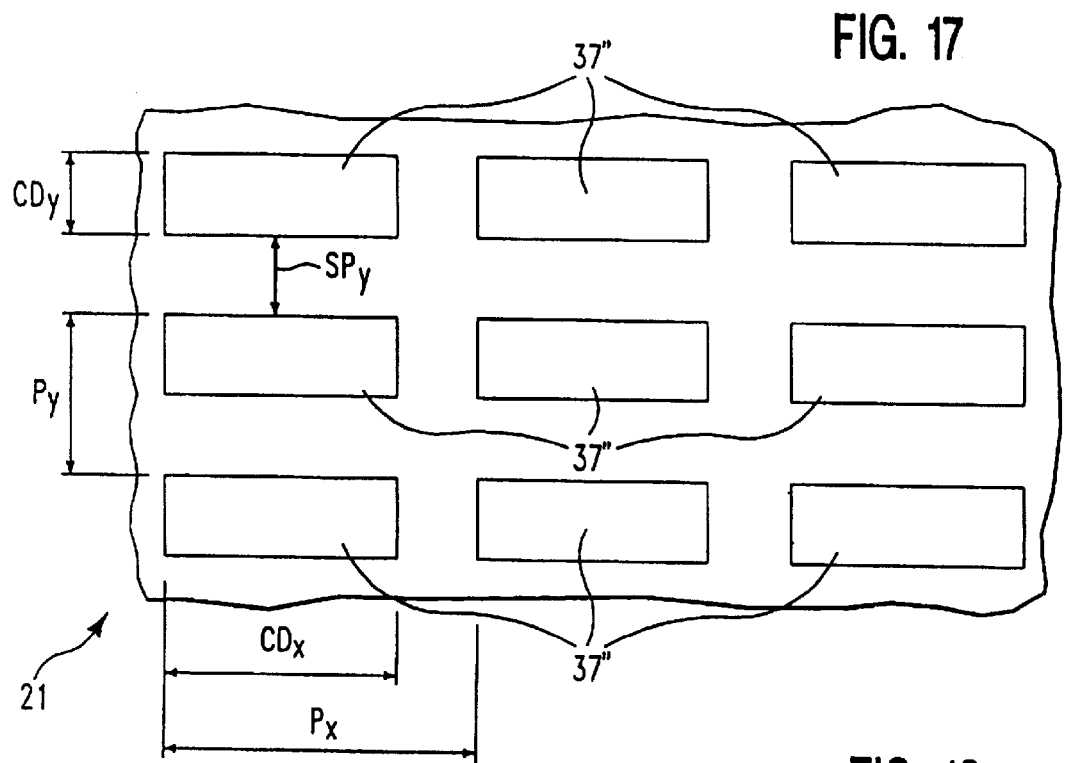
FIG. 18 shows the result of the process of FIG. 17 with a device having an array of elements formed.

FIG. 18 shows the result of the process of FIG. 17 with a device having an array of elements formed.

Having produced the exposed in photoresist regions 37' shown in FIG. 17, the conventional etching through ARC is made and the combined image illustrated in FIG. 18 may now be transferred onto the substrate by a required conventional progress, such as reactive ion etching, doping, directional or chemical vapor deposition. The image in FIG. 18 has the features and critical dimensions of the desired pattern shown and explained in conjunction with FIG. 10.

As the further step(s) in the sequential formation of simple and controllable images, transferring them onto the substrate, modification of substrate properties (if required) so as to enhance or suppress printability in the subsequently deposited onto thus modified substrate, as explained earlier, consider further processing of the dense array of FIG. 18. When a finite array of well-defined features of FIG. 10 is required, the shapes in FIG. 18 are next processed so as to enhance printability within the confines of small rectangular shapes with dimensions $CD_x$ and $CD_y$. Then the new photoresist is deposited and a large shape 111, not as well controlled for critical dimensions and image placement, is imaged. Photoresist will be exposed enough to become soluble only within the small rectangles 37" within shape 111. As a result, the well-defined array (three shapes in a row arranged in three rows) of features 37" is recorded in photoresist and may be transferred onto the substrate. Dimensions and placement of image 111 need only be so good as to expose features where required, to "initialize" them. That means that edge-to-edge overlay of feature 111 imaged onto photoresist covering the array of rectangle 37" need only be comparable with the entire critical dimensions of the prior level, that is, this overlay must be better than $CD_x$ in X-axis and $CD_y$ in Y-axis.

Figure 14:
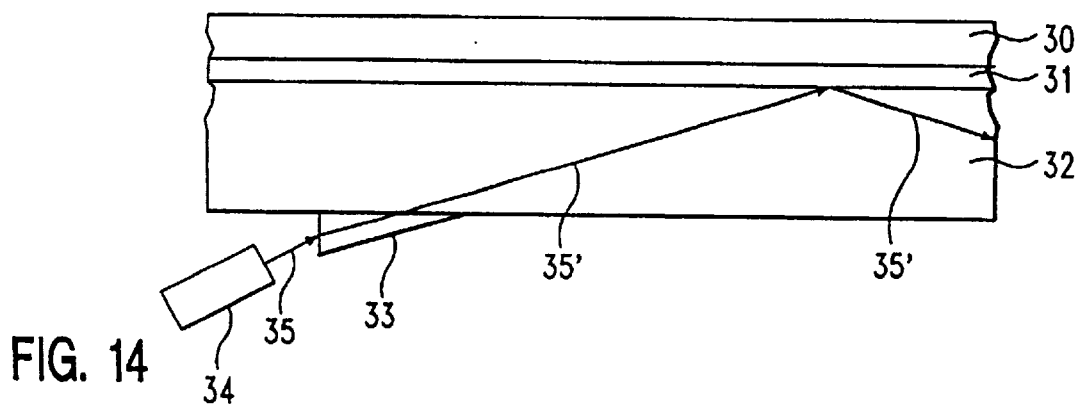
FIG. 14 illustrates an arrangement for the purpose of patterning lithographic images, in which photoresist is placed upon film to be patterned, which is in turn formed (or placed) on a substrate which is adapted to serve as a waveguide.

Initializing the finite size arrays may be the first and only lithographic operation conducted by the customer of blanks pre-patterned with (even) unbounded arrays of rectangular shapes illustrated in FIG. 14. Therefore, such "initialization" step may also be viewed as a "customizing" step may be made by the device manufacturers, as required for their specific purpose, on the inexpensive and well-controlled mass-produced standard sized and standard composition blanks of suitable workpieces.

As in the case of phase mask technology, complementary shapes may be used in sequential printing on substrates with modified printability in order to define the more complex connected and interleaving shapes with critical dimensions $CD_x$, $CD_y$, $SP_x$, $SP_y$ initialized where required from the initially patterned only by a one- or two-dimensional grating.

Application of Image Self-Correction to Matching Optical-to-Optical and X-ray-to-Optical Lithography Problem:

As explained in connection to the practice of microlithography in prior art of Booth et al., in order to maintain a tight level-to-level edge-to-edge overlay budget, critical dimensions of each level and level-to-level centerline overlay are controlled individually. Contemporary prior art does not accommodate for the deviations from nominal dimension in an existing level, other than by making limited adjustments of distortion and dose at the exposure tool. As a result, much of the error in control of critical dimensions and distortions, is not corrected and is additive in the edge-to-edge overlay budget, necessitating tight control of each individual level.

While, in a particular case, (we can use the next as an example) we can assume that one of the two imaging layers to be matched well has a large degree of distortion and appears useless for product manufacture in the current state of the art, it may nevertheless contain images of the highest resolution or have some other desirable property. Prior art does not accommodate for deviation from nominal dimensions of such an imaging level, leading to considerable problems in managing the tight budget of dimensional control. For a detailed account, see Yanof et al.

A limited solution of the problem which can be achieved in accordance with the practice of the prior art is only by employing "feed forward" of low order distortion corrections to the process of building one or the other mask being built. A broader solution in prior art is to measure/estimate the amount of imperfection on as many as necessary small patches within either the mask or the printed image of a prior imaging level and attempting to make many patch-wise corrections to the design data of the reticle of the next matching level. This is a tedious data-intensive procedure which also requires the utmost control of both metrology and mask patterning. It is very similar to correction of printed image size by multiple adjustments in the mask. (For details, see Nissan-Cohen, 1987; Ito, 1986), as opposed to a single change which leads to varying amounts of adjustment, as required (For details, see A. Starikov, SPIE, 1989). This broader solution (by an elaborate measure-and-correct data-intensive procedure of modifying the mask/reticle, based on measured and predicted error of dimensional control) is now becoming a new technology in its own right (For a review of this art, see Henderson et al., "Optical Proximity Effect Correction: An Emerging Technology", Microlithography World, Summer 1994; pp. 6–12). Optical Proximity Correction (OPC) is capable of correcting errors in both linewidth and placement (distortion), albeit for an unacceptably high price.

The effective and efficient alternative is to use self-correcting lithography and let the process of printing make all the necessary adjustments.

Using self-correction at the time of printing on a wafer (substrate) described in a preceding section of this document is one such method. Another method involves making a new mask/reticle in such a manner that the new image is printed with utilization of image self-correction on a mask/reticle blank already reflecting some properties of the mating, or matching or prior or later mask/reticle image and/or printing property of the printing apparatus. One can adapt any known method of image formation and recording to achieve image self-correction. In the extreme cases, parts of a nearly completed integrated circuit may be activated to verify that it is functional and, while at that, enable further wiring into the circuit of only those redundant cells which are, in fact, confirmed by such an activation test as functional.

There exist a great many ways to utilize the underlying principle of self-correction of the new image printing over a previously patterned substrate, to achieve the goal. These will become clear to those skilled in the art, once the needs and the environment of an application are defined.

One Typical Embodiment

One preferred embodiment is described here, for a case in which image self-correction is used to produce a dedicated mask/reticle set (two, obvious extension to many).

Figure 19A:
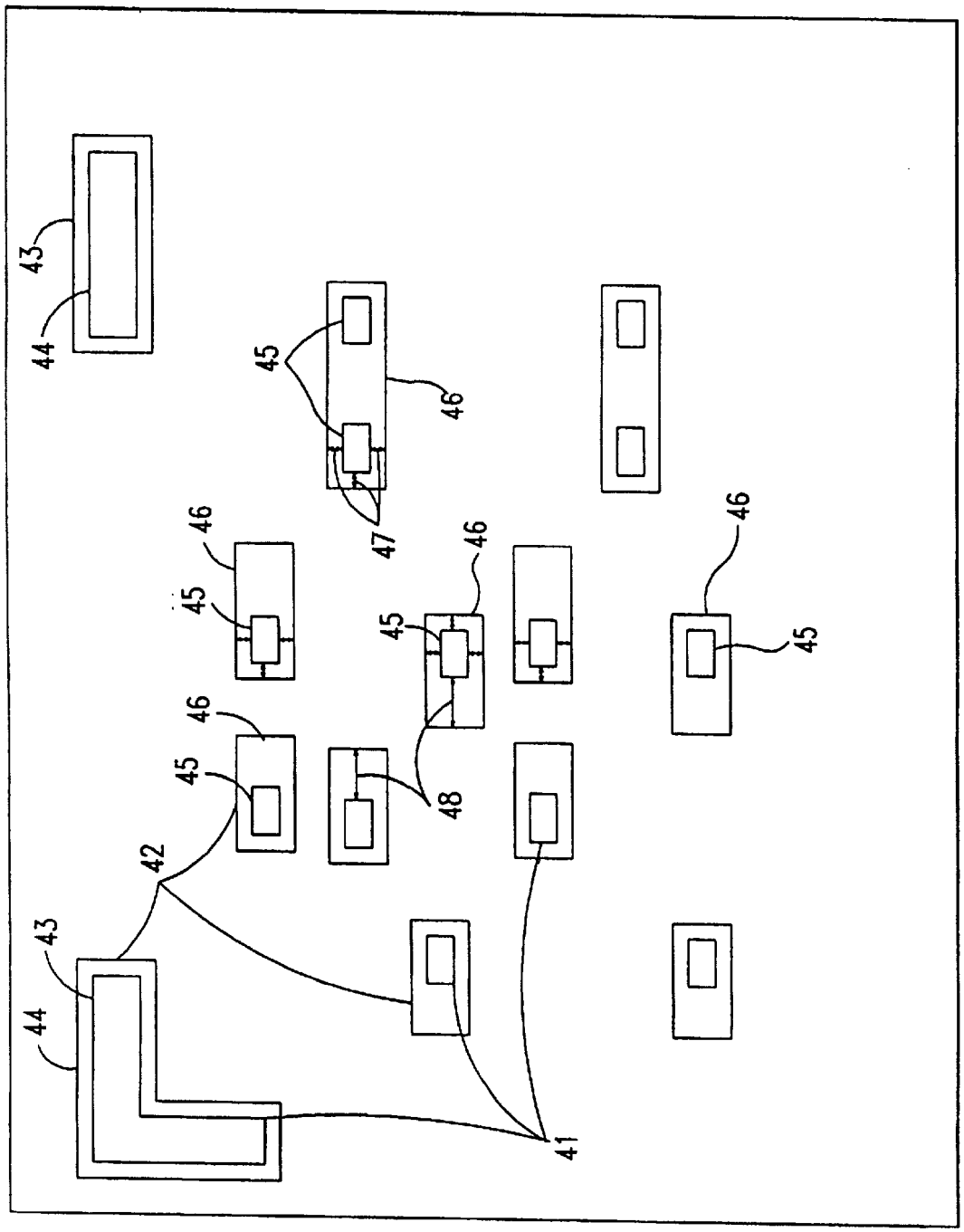
FIG. 19A illustrates the desired pattern to be produced using two level patterning including arrangement and tolerances.

FIG. 19A illustrates a pattern with a desired arrangement and tolerances as well as the size and positioning of elements of a portion of an IC design in which two pattern levels 41 and 42. Inner shapes of the first pattern level 41 with the small CDs and the outer shapes 42 of a second pattern level) have proper CD's and are superimposed, as desired, i.e., without the usual level-to-level centerline overlay errors. Proper is a nominal value, as designed.

To produce an aligned exposure on wafers (and, possibly, to manufacture the masks/reticles) alignment marks are required. In particular, alignment mark (key) 43 of the first pattern level 41 and alignment mark 44 of the second pattern level 42 are required. It is essential to observe that the features of both first and second pattern levels 41 and 42, especially circuit images 45 of first pattern level 41 and circuit features 46 of second pattern level 42 maintain a tight tolerance 47 in edge-to-edge overlay in all directions, either for each feature or for the circuit as a whole. In this example "the tight tolerance" is the minimal values allowed by the groundrules. There may also be some cases and features, where the edge-to-edge tolerance are relaxed, e.g. in the case of loose tolerance areas 48.

Figure 19B:
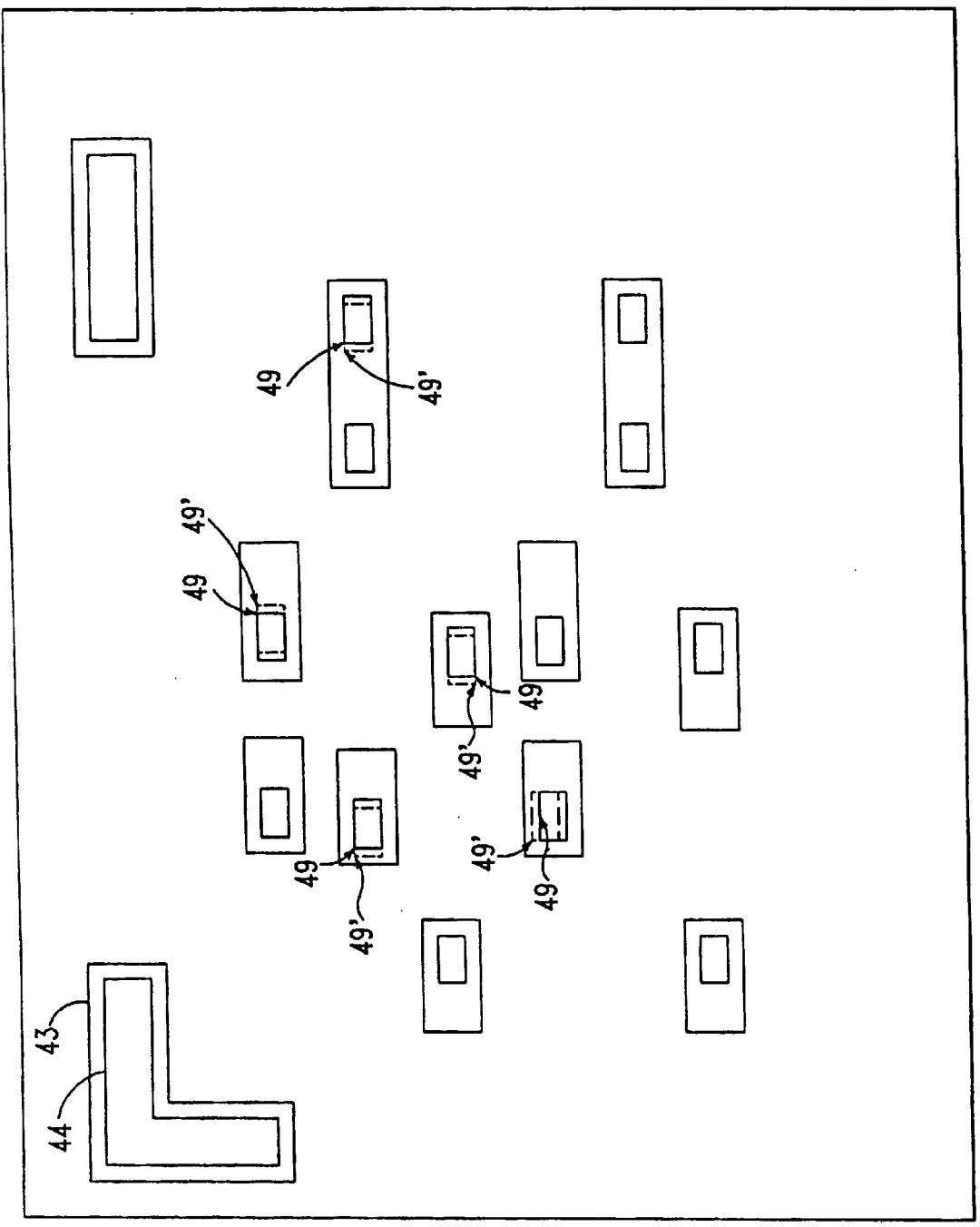

In practice, masks and their images are built with imperfections in both CD and centerline control. In FIG. 19B, a prior art system is illustrated showing an arrangement of FIG. 19A with the actual positions of some circuit shapes 45 of FIG. 19A of first pattern level 41, shown misplaced in reference to circuit features 46 of second pattern level 42, even though the alignment marks 43 and 44 are perfectly concentric in the sense that the alignment marks 43 and 44 are aligned in both the x and the y directions. Shapes 49 shown in FIG. 19B of the image of first pattern 41, thus affected are shown in solid lines, while the intended positions 49' of edges of parts 49 are shown in dashed lines corresponding to shapes 45 of level 41 in FIG. 19A. The gap, also called level-to-level, edge-to-edge overlay illustrated between parts 49 and positions 49' may be a result of low order image distortion due to the mask writer used to create the mask for the first pattern level 41 or of the printer used to form its image in manufacture of ICs, a consequence of processes of image recording and/or transfer. These may also be the more troublesome short range systematic errors and/or random errors in either image recording and/or transfer.

The problem in the prior art as shown in FIG. 19B is failure of centerline overlay control of first pattern level 41 in FIG. 19A. While first pattern level 41 may possess the highly desirable small CD of circuit shapes 45 in FIG. 19A, it also possesses distortion, which in the edge-to-edge, level-to-level budget of prior art is additive to the like errors of the matching pattern level 42 of FIG. 19A, as well as additive to CD errors of both pattern levels 41 and 42 shown in FIG. 19A. In practice of the prior art, each component of edge-to-edge level-to-level overlay must be controlled; and failure of either the first pattern level 41 or the second pattern level 42 to comply with the groundrules derived from this mode of operation is likely to cause a defective circuit. Hence, whenever a failure to comply to such rigid tolerances is discovered during product quality assurance, the workpiece is either reworked or discarded. Therein lies a massive inefficiency of the prior art.

In the practice of the new art in accordance with this invention, a much greater degree of imperfection in dimensional control of either level is accepted and the image of the matching level is adjusted so as to, nevertheless, produce the tight edge-to-edge level-to-level overlay, as required by the marketplace.

FIG. 19C shows the pattern 42' as a print of the "easy" level of FIG. 19A with the desired placement of critical images 41 of FIG. 19A shown for illustration only. There are many ways to adjust the masks of the two levels, so as to match and cancel out distortions and image size variations of one level or to produce a mask/reticle of one of the two levels. The following sequence aims to manufacture a mask of the first pattern level 41 in FIG. 19A, using the mask and imaging methods associated with formation the second pattern level 42 of a device in FIG. 19A. Hence, FIG. 19C shows the image 42' of the second pattern 42 in FIG. 19A as a reference level. Errors in that level will be matched by the other one and, therefore, are not shown.

Figure 19D:
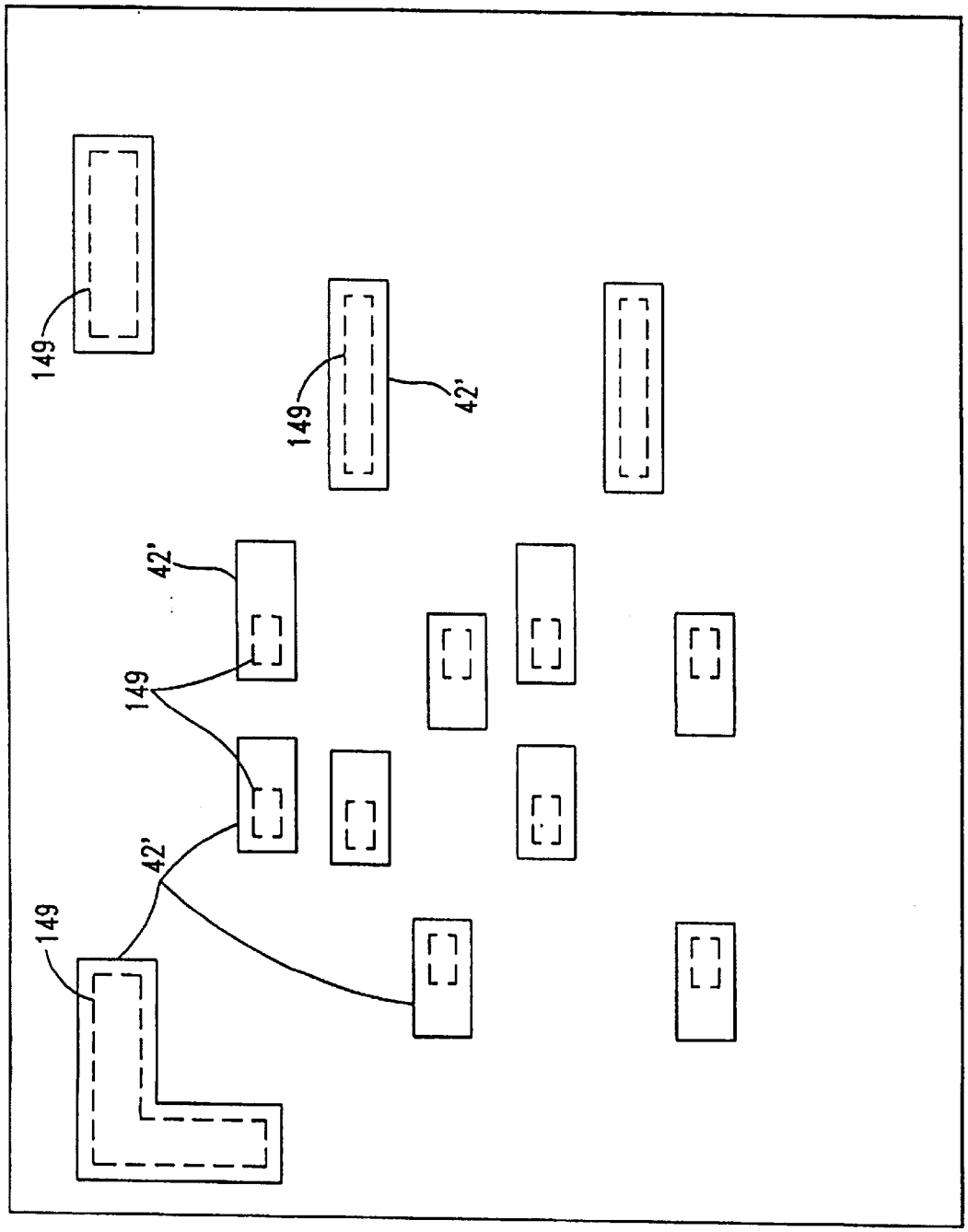
FIG. 19D illustrates the pattern of FIG. 19C printed on a mask blank using the self aligned process.

FIG. 19D shows the pattern 42' of FIG. 19C printed on a mask blank with self-aligned by process means replicas 149 of this image. In order to better practice self-correction of the image of first pattern level 41 of FIG. 19A to be printed on the same mask/reticle blank illustrated as 53 in FIG. 19C, one may use, as shown in FIG. 19E, a process-driven modification 149 of the prior level image 42' shown in FIG. 19D.

During formation of the auxiliary image 149 in FIG. 19D, feature size bias due to over/under-exposure, over/under-developing, reactive ion etch (RIE), wet etch, sidewall formation methods of any kind may be used to replicate the image of modified second pattern level printed as image 42' on the mask blank (of image level 42 in FIG. 19A), so as to delineate areas of enhanced and inhibited optical printing. In order to enhance the optical printing over regions within borders of these derivative images 149, a residual partially planarized ARC may be used, as shown in FIGS. 6, 7, 8. Likewise, to inhibit printing outside of the confines of images 149, the thickness of single layer resist (SLR) may be adjusted for maximum reflectivity at an actinic wavelength as shown in FIG. 8. In order to still print to size over an ARC within confines of images 149, the exposure dose of the next exposure of this mask/reticle blank may be increased.

Figure 19E:
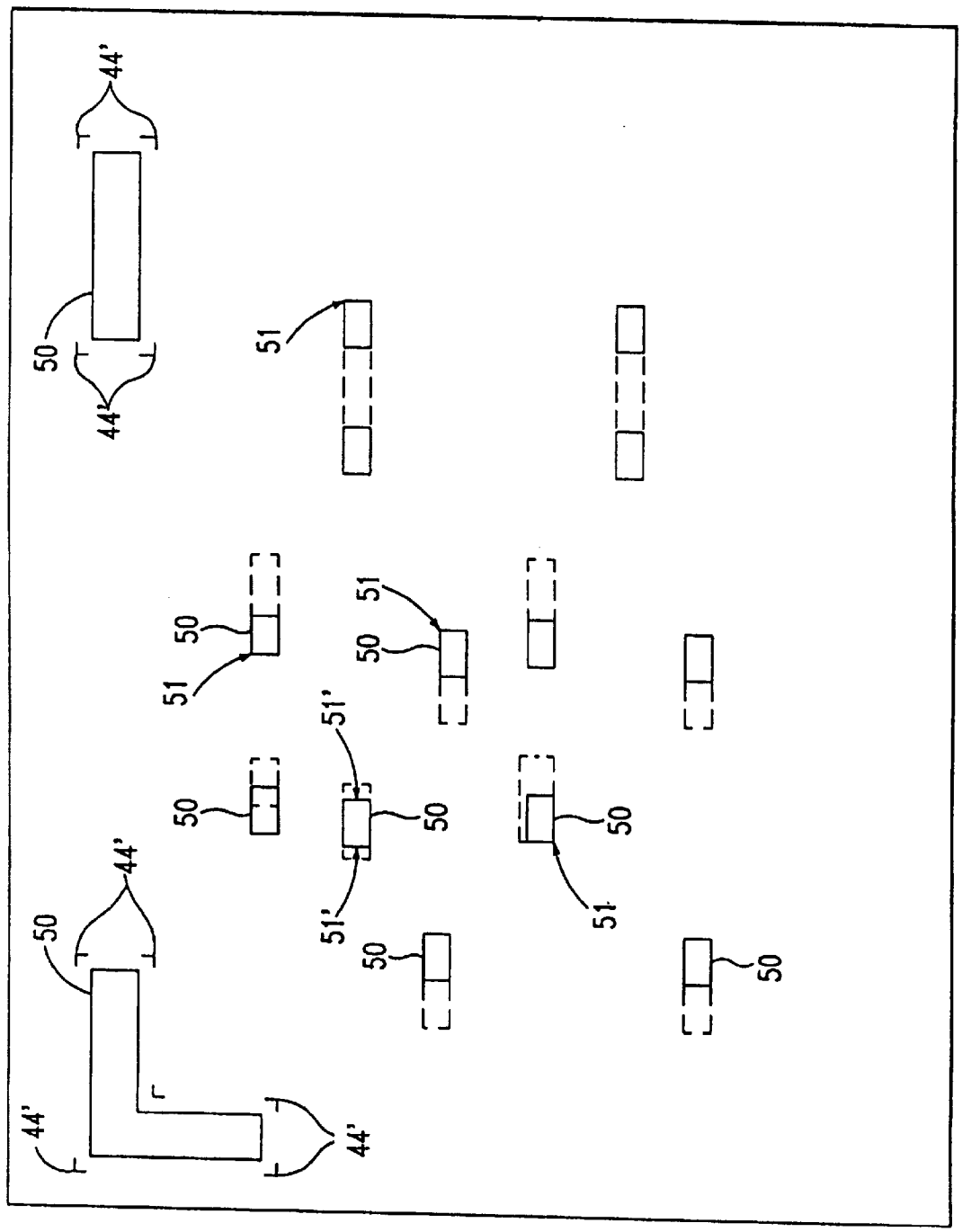
FIG. 19E illustrates the patterns of FIG. 19B which are succeptable to distortion together with the corrections for the distortions.

FIG. 19E shows only the distorted image patterns 49 of FIG. 19B with a self-aligned replica of the "easy" level, with correction in the next step of the critical image. Following an aligned (as shown in relation to boundaries 44' of alignment marks 44 of FIG. 19A) exposure of thus prepared mask/reticle blank, the image 50 in FIG. 19E is now formed (to produce the adjusted images of level 41 of FIG. 19A.) Self-correction of the new image 50 will occur as explained in conjunction with FIG. 9. As a result, locations 51 (correction by trimming back in print of critical level image) of image 50 in FIG. 19E are pulled back to within confines 149 in FIG. 19D. Areas 51', not limited by the tightest level-to-level edge-to-edge groundrule, are not near the boundaries 149 and they are not corrected. That, however, is not a critical area of the circuit, as reflected in design groundrules illustrated in FIG. 19A.

Figure 19F:
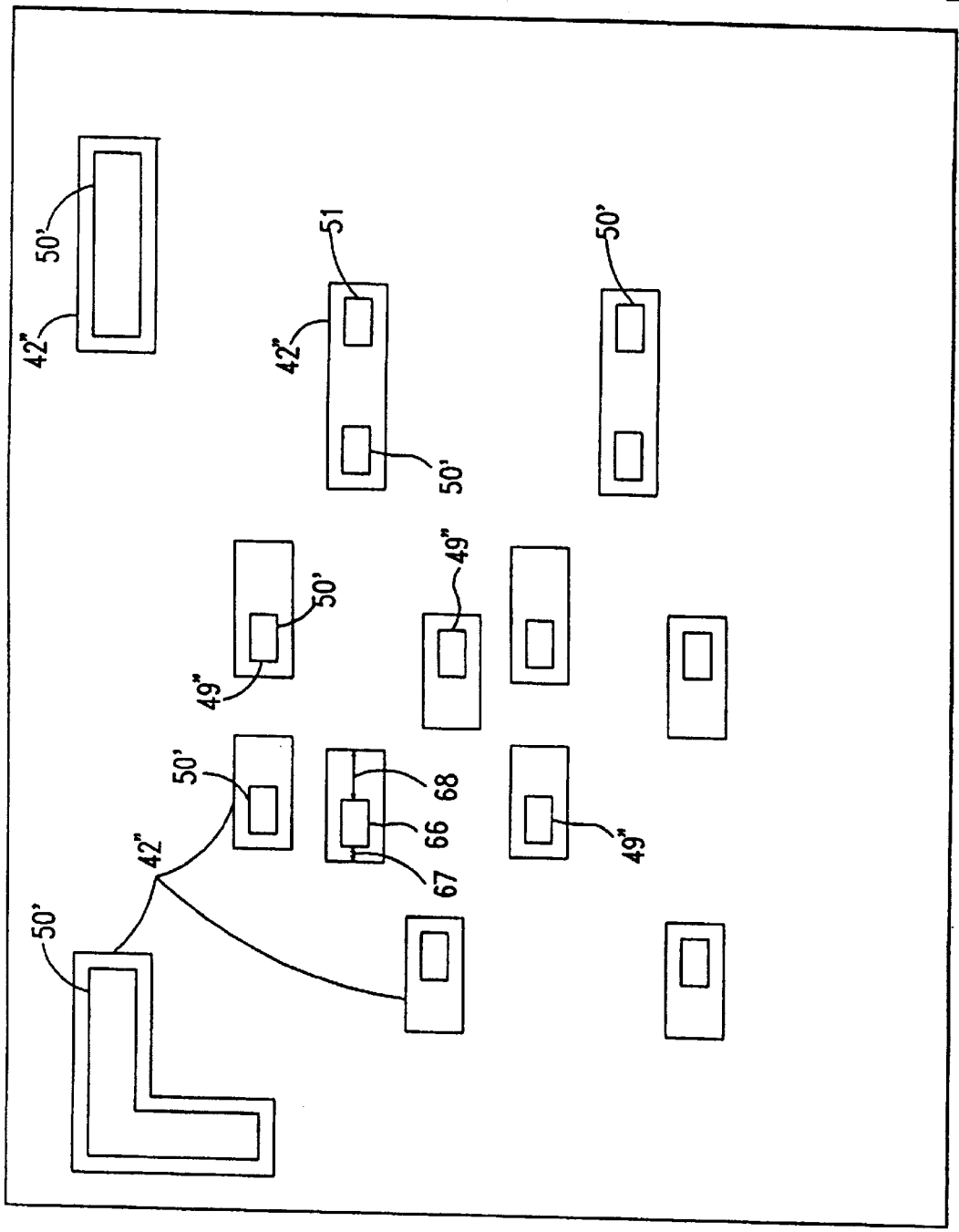
FIG. 19F illustrates a match of the two masks and the distortions of the printing to achieve the desired patterns.

FIG. 19F the pattern 42 of designed "easy" pattern 42 of FIG. 19A shows "easy" and corrected critical images 50' (formed as images 50 in the process of self-corrected mask print illustrated in FIG. 19E), are shown superimposed to illustrate the achieved improvement in edge-to-edge, level-to-level overlay. Once the image 50 in FIG. 19E is formed, the masking material such as chrome, tungsten, gold etc. may be deposited into the openings or etched away, as required for the masking level with images 41 in FIG. 19A. This image is modified, compared to image 49 in the prior art illustrated in FIG. 19B. The critical would be design rule violations in placement of shapes 49 in FIG. 19B were corrected as can be seen in edge-to-edge overlay of shapes 50' to shapes 42".

In FIG. 19F feature sides 49" are those sides, where image self-correction resulted in the image being pulled back, as desired. All sides not affected by self-correction are shown printed in their old positions, as in FIG. 19B. One feature, 66, in FIG. 19F, which was out of place, was not corrected. However, the spacing 67 on the left of feature 66 is increased and will not lead to device malfunction. The spacing 68 on the right of feature 66 was to be defined to a larger tolerance (loose tolerance 48 in FIG. 19A) and so its reduction—as long as not excessive—is also a possible accommodation.

Overall, FIG. 19F illustrates a perfect match of the two masks/reticles and, possibly, distortions of printing.

If self-correcting is not also used in the actual device print, its level-to-level edge-to-edge overlay only contains image size variability due to printing alone, as well as the average error of alignment and any drifts in the state of masks, wafers, and printing apparatus from their respective states at the time the matched masks were made. The bulk of the level-to-level edge-to-edge errors due to errors in CD and distortion control in both masks and in both printing steps have been matched (accommodated) in accordance with this invention.

Clearly, improvement in level-to-level edge-to-edge overlay was achieved by accepting some image size variation in level 41 of FIG. 19A, seen as image size variations in shapes 50' in FIG. 19F. Since all features of this level printed to size or undersized, the population of CD's in this printed imaging level is, on average, slightly undersized. To further improve dimensional control, it is possible to adjust the exposure dose, print or etch bias, so as to produce an average value of CD's as required, i.e., without any bias. This is a typical practice of the prior art which may be retained in the new art.

The sequence of steps outlined here, which lead to building a pair of dedicated masks/reticles, may have alternatively begun with the mask/reticle of level 41 in FIG. 19A. Indeed, in many cases one may be forced to accept "the best can do" 1× X-ray mask, distorted in its mount and further distorted by the unique heat wave distortion mechanisms during the X-ray printing (for details, see Yanof et al.) A fully dedicated set of matching optical 1× masks can then be built to suit, enabling a high overlay performance lithography with any advantages of X-ray lithography at a single level (typically, gate conductor, for its small image size and large process window).

All steps can (in accordance with this invention), alternatively still, be initiated from a "seed" mask/reticle. While not necessarily a mask/reticle of any particular device image level, such a mask/reticle may be used to cross-link and dedicate to each other all those real image levels, where the demands on dimensional control of image size, centerline overlay, or edge-to-edge overlay are the most stringent ones. Referring to FIG. 19D, image shapes 149 may serve as such a "seed" image level.

While this invention has been described in terms of the above specific embodiment(s), those skilled in the art will recognize that the invention can be practiced with modifications within the spirit and scope of the appended claims, i.e., that changes can be made in form and detail, without departing from the spirit and scope of the invention. Accordingly all such changes come within the purview of the present invention and the invention encompasses the subject matter of the claims which follow.

What is claimed is:

1. A process comprising:
   a) providing a substrate with an existing pattern in a non-planar surface with a non-planar topology or non-uniformly reflective feature on said surface,
   b) treating said substrate by applying an antireflective coating to delineate said existing pattern on said non-planar substrate surface as a topological feature,
   c) adjusting said topologial feature to delineate a desired new pattern in response to radiation with electromagnetic energy associated with said topological feature defined by said existing pattern,
   d) said topologial feature enabling an optical exposure phenomenon which is activated by illuminating a new pattern onto said non-planar surface, as a function of said existing pattern,
   e) forming a radiation sensitive layer which is responsive to radiation with electromagnetic energy over said surface of said substrate including said topological feature, and f) activating said radiation with electromagnetic energy to define a new pattern in said radiation sensitive layer with said new pattern being formed by exposure to said electromagnetic energy in a maskless step.

2. The process of claim 1 wherein said pattern comprises a one dimensional grating with non-uniform reflectivity produced by an interferometric process, whereby a complementary grating is imaged onto said substrate and then patterned to take advantage of said non-uniform reflectivity.

3. A process for forming a new pattern on a substrate comprising:

providing a substrate with an upper layer formed over said substrate, said upper layer having a non-planar surface with topological features defined by a previous pattern of openings in said substrate filled with an AntiRefleCtive (ARC) layer having a non-uniform reflectivity of electromagnetic energy, said substrate and said ARC layer providing a surface with features having a non-uniform reflectivity of electromagnetic energy defined by an antireflective pattern previously formed in openings in said substrate by said ARC layer extending into said openings below said surface of said subtrate, adjusting said topologial features by etching to be responsive to radiation with electromagnetic energy so as to delineate a desired new pattern as a function of said radiation with electromagnetic energy associated with said topological features defined by said previous pattern, applying an image recording material comprising photoresist to said surface, said image recording material being sensitive to electromagnetic reflectivity, and employing said features with said non-uniform reflectivity of electromagnetic energy to delineate said new pattern in said image recording material by non-uniform reflectivity of electromagnetic energy from said ARC layer to provide variable recording of said new pattern in said image recording material by activating said radiation with electromagnetic energy in a maskless step to define said new pattern in said upper layer, with said upper layer being patterned with said new pattern by exposure to said electromagnetic energy.

4. A process for forming a pattern on a substrate comprising:

a) providing a substrate having a surface with a previously formed opening formed in said surface with sidewalls, b) forming an antireflection coating (ARC) layer over said surface of said substrate including said opening, c) planarizing said ARC layer down to said surface with some of said ARC layer remaining filling said opening forming residual ARC in said opening, d) forming a Single Layer photoResist (SLR) layer over said substrate and said residual ARC layer including said opening, said SLR layer being composed of a material sensitive to radiation with electromagnetic energy associated with said residual ARC layer in said opening, and e) activating said SLR layer by radiation with electromagnetic energy to form a new opening in said SLR layer defined by said residual ARC layer in said substrate, whereby said SLR layer is patterned with said new opening by exposure to said electromagnetic energy in a maskless step.

5. The process of claim 4 wherein said planarizing is performed as follows:

a) partially planarize said ARC layer, b) perform a blanket etching removal step by a method selected from etchback and $O_2$ ashing down to the level of the top of said substrate.

6. The process of claim 4 wherein thickness of said SLR layer is adjusted to maximize reflectivity of said SLR layer.

7. The process of claim 4 wherein thickness of said SLR layer has minimal reflectivity comprising antireflectivity.

8. The process of claim 4 wherein said planarizing is performed as follows:

a) partially planarize said ARC layer, b) perform a blanket etching removal step by a method selected from etchback and $O_2$ ashing down to the level of the top of said substrate, and the thickness of said SLR layer is adjusted to maximize reflectivity of said SLR layer.

9. The process of claim 4 wherein said planarizing is performed as follows:

a) partially planarize said ARC layer, b) perform a blanket etching removal step by a method selected from etchback and $O_2$ ashing down to the level of the top of said substrate, and the thickness of said SLR layer has minimal reflectivity comprising antireflectivity.

10. A process comprising:

providing a substrate having a non-planar surface with a space comprising a topological feature in said surface, coating said substrate including filling said space with an AntiReflective Coating (ARC) layer comprising an absorber of radiation, planarizing said ARC layer down to said surface of said substrate providing a planarized surface leaving said ARC layer filling said space of said topological feature thereby forming an ARC feature, forming a radiation sensitive layer which is responsive to radiation with electromagnetic energy and which covers said surface of said substrate including said ARC feature, thereby patterning the radiation sensitive layer with electromagnetic energy patterned by said ARC feature in a maskless step as a function of the fact that said radiation sensitive layer is responsive to radiation with electromagnetic energy as patterned by said ARC feature.

11. The process of patterning a mask with another mask in accordance with claim 10 whereby self-corrected matched masks are provided.

* * * * *